United States Patent [19]

Hill

[11] Patent Number: 5,406,495

[45] Date of Patent: Apr. 11, 1995

[54] SUBSTATION LOAD DISTRIBUTION MONITOR SYSTEM

[75] Inventor: Gregory O. Hill, San Diego, Calif.

[73] Assignee: Systems Analysis and Integration, Inc., Orange, Calif.

[21] Appl. No.: 12,280

[22] Filed: Feb. 1, 1993

[51] Int. Cl.$^6$ ............ G01R 25/00; G01R 21/06
[52] U.S. Cl. ............ 364/483; 364/492; 364/487; 324/142; 324/141; 323/212
[58] Field of Search ............ 364/550, 483, 492, 487; 324/142, 76.11, 76.21, 76.24, 141; 341/123; 323/205, 212

[56] References Cited

U.S. PATENT DOCUMENTS

| | | | |
|---|---|---|---|
| 3,824,498 | 7/1974 | McBride | 332/9 R |
| 4,148,087 | 4/1979 | Phadke | 361/80 |
| 4,547,726 | 10/1985 | Premerlani | 324/782 |
| 4,661,769 | 4/1987 | Girgis | 324/782 |
| 4,672,555 | 6/1987 | Hart et al. | 364/483 |
| 4,730,257 | 3/1988 | Szeto | 364/484 |
| 4,741,023 | 4/1988 | Lawson | 379/106 |
| 4,745,512 | 5/1988 | Hampson | 361/36 |
| 4,761,634 | 8/1988 | Yamaguchi et al. | 340/347 AD |
| 4,794,369 | 12/1988 | Haferd | 341/123 X |
| 4,815,002 | 3/1989 | Verbanets | 364/483 X |
| 4,847,780 | 7/1989 | Gilker et al. | 364/483 |
| 4,901,244 | 2/1990 | Szeto | 364/481 |
| 4,907,165 | 3/1990 | Toda | 364/483 |
| 4,979,122 | 12/1990 | Davis et al. | 364/483 |
| 5,006,846 | 4/1991 | Granville et al. | 340/870.28 |
| 5,017,860 | 5/1991 | Germer et al. | 324/142 |
| 5,132,610 | 7/1992 | Ying-Chang | 364/483 X |
| 5,151,866 | 9/1992 | Glaser et al. | 364/483 |
| 5,170,115 | 12/1992 | Kashiwabara et al. | 324/142 |
| 5,179,376 | 1/1993 | Pomatto | 364/483 X |
| 5,224,054 | 6/1993 | Wallis | 364/483 |
| 5,243,536 | 9/1993 | Bradford | 364/483 |
| 5,243,537 | 9/1993 | Neumann | 364/483 X |

Primary Examiner—Emanuel T. Voeltz
Assistant Examiner—Eric W. Stamber
Attorney, Agent, or Firm—Knobbe, Martens, Olson & Bear

[57] ABSTRACT

The monitoring and control system of the present invention provides a distributed intelligence, data acquisition and control system which collects and analyzes large amounts of data representing power usage from a power distribution substation. Using a Discrete Fourier Transform, the system provides accurate tracking of the primary frequency of the voltage and current waveforms in the power equipment, and determines the relative phase between the voltage and current waveforms. The system provides real time monitoring of power usage and real time control of various functions in the substation.

11 Claims, 13 Drawing Sheets

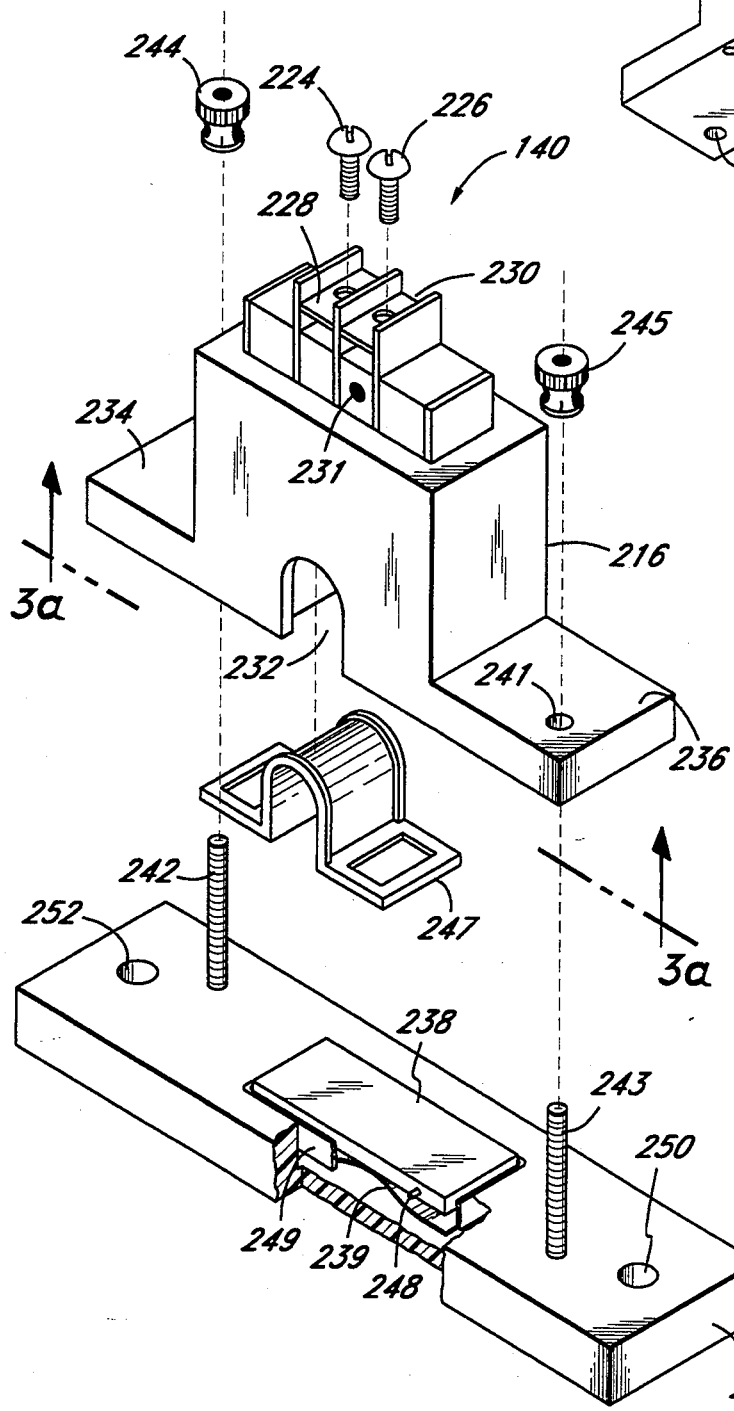
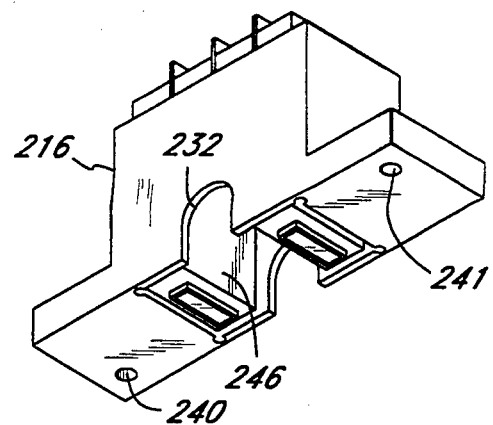
FIG. 3
FIG. 3a

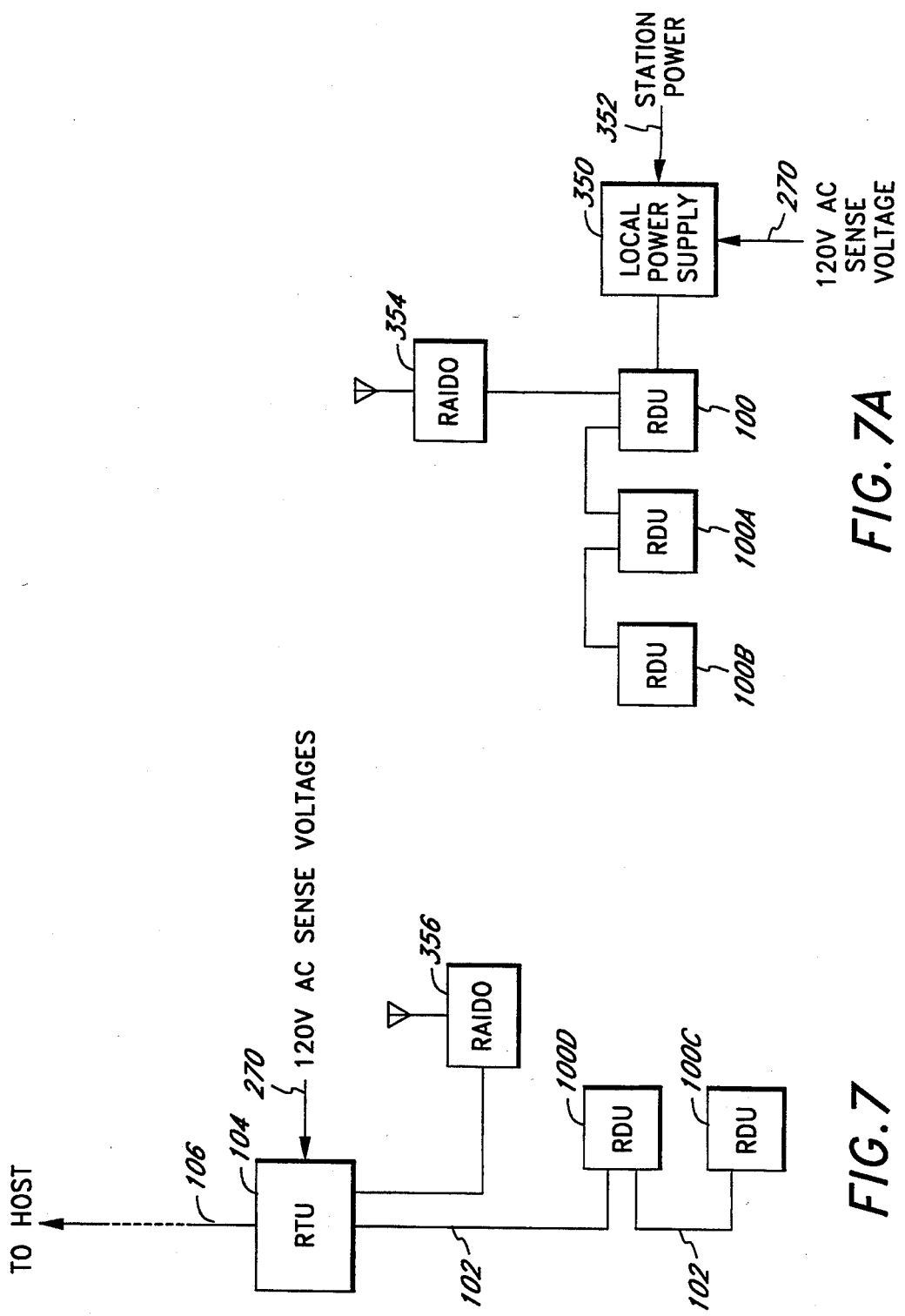

SUBSTATION LOAD DISTRIBUTION MONITOR SYSTEM

BACKGROUND OF INVENTION

1. Field of the Invention

The present invention relates to improvements in monitoring and controlling substation power distribution. Specifically, the invention involves a method and apparatus for automatically monitoring substation power distribution and usage and transmitting the information to a remote location in order to provide real time, improved-accuracy monitoring of consumer loads and to control a power distribution substation from a remote location.

2. Description of the Related Art

At each power substation, there are generally transmission and distribution circuits, transformers, circuit breakers, capacitor banks, and other electrical equipment (hereinafter "power equipment") which deliver electrical power. The various pieces of electrical equipment, including the circuits and transformers, are protected for overload and fault conditions by monitoring the current in each phase of the equipment. The normal method of monitoring this current is by using a current transformer. A current transformer transforms the primary current (normally in the range of 100 to 3000 amps) to a secondary current in the range of 5 amps. The secondary current is then monitored via protection equipment, and upon detection of an overload or fault, the protection equipment will trip (open) the appropriate breakers to terminate the fault.

Because the current transformer has a known primary to secondary ratio, the current transformer can also be considered as a current sensor. This current sensor is used via a transducer in many substations to provide a DC signal which is representative of the primary current.

SUMMARY OF THE INVENTION

The current sensor may be used to monitor the primary current waveform using a Discrete-time Fourier Transform (DFT). Because accuracy in a Fourier analysis is effected by whether an integer number of samples are taken per cycle, it is important that the actual fundamental frequency of the primary current waveform is known.

The present invention involves a system for monitoring the power in a power distribution system. More specifically, the present invention involves a method of tracking the actual frequency of the primary current waveform and of determining the absolute and relative phase between periodic voltage and periodic current waveforms by applying a discrete Fourier Transform to discrete samples from the periodic waveforms.

One aspect of the invention, therefore, involves a method of determining the relative phase between a periodic voltage waveform and a periodic current waveform carried in power equipment. This method has a number of steps. First, the periodic current waveform and the periodic voltage waveform are sampled to obtain first and second sets of sample values. Advantageously, the sampling is carried out with a digital to analog convertor. The first set of sample values is a representation of the periodic current waveform and has discrete sample values substantially equally spaced in time. Similarly, the second set of sample values is a representation of the periodic voltage waveform and has discrete sample values substantially equally spaced in time. The sampling rate is such that an integer number of samples are taken substantially within full cycles of the current and voltage waveforms.

Next, a discrete Fourier Transform is applied to the sample points of the voltage and current waveforms to obtain the phase of the periodic voltage waveform and the phase of the periodic current waveform. These phases are compared to obtain a relative phase between the voltage and current waveforms.

The sample values can also be used to calculate an RMS voltage and an RMS current. Then by multiplying the RMS current by the RMS voltage, the volt-amps are obtained. The watts are then determined by multiplying the volt-amps by the cosine of the relative phase, and the vars are obtained by multiplying the volt-amps by the sine of the relative phase. Three-phase quantities can also be calculated in a three-phase system.

Another aspect of the present invention involves tracking the frequency of the primary current or voltage waveform in order to maintain a sample rate that obtains an integer number of samples per cycle of a periodic voltage or current waveform carried by power equipment. In summary, the tracking involves sampling the voltage periodic waveform at a sampling rate selected to obtain a set of samples covering substantially a first cycle of the periodic waveform. At least four samples equally spaced in time in the first cycle are transformed through a discrete Fourier Transform to obtain a first X transform value and a first Y transform value. The periodic waveform is sampled at the selected sampling rate to obtain a second set of samples covering a portion of a second cycle of the periodic waveform. At least one of the samples from this second set of samples is transformed by means of a discrete Fourier Transform to obtain a second X transform value and a second Y transform value. The first Y transform value, the second Y transform value and the second X transform value are analyzed to determine if the sampling rate is too fast or too slow. The sample rate is then adjusted in response to the comparison to insure that a predetermined integer number of samples are taken per cycle of the periodic waveform.

BRIEF DESCRIPTION OF THE DRAWINGS

FIGS. 3 and 3a depict a clamp-on current transformer.

FIG. 7 and FIG. 7a are block diagrams showing an embodiment with RDUs operating remote to the main RDU/RTU combinational system

DETAILED DESCRIPTION OF THE PREFERRED EMBODIMENT

Figure 1:
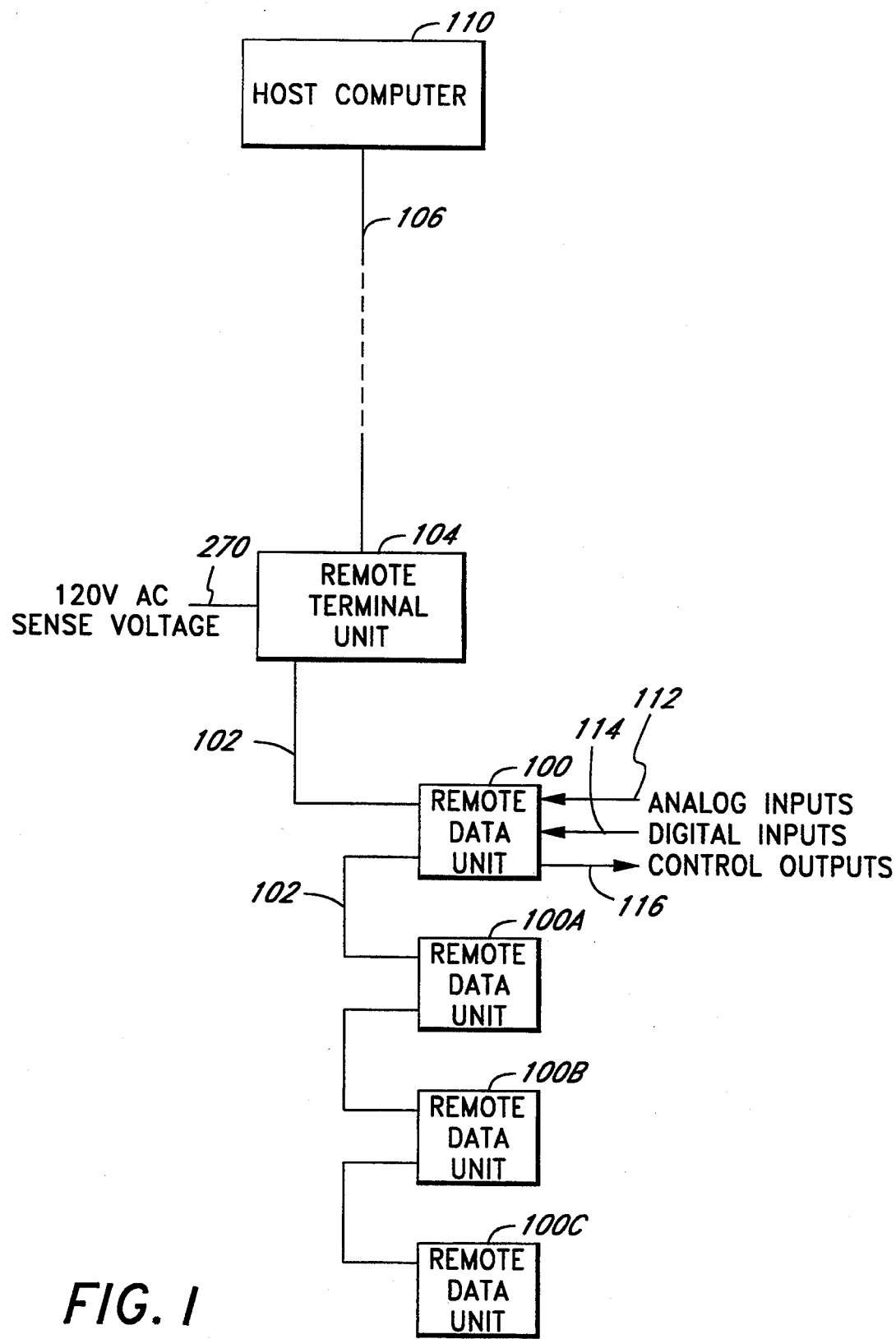
FIG. 1 is a block diagram of the power monitoring system of the present invention.

FIG. 1 depicts the overall system block diagram of the present invention. The system comprises, a plurality of remote data units (RDUs) 100, 100A, 100B, 100C, which are chained together with a daisy chain cable 102 which connects the remote data units to a remote terminal unit (RTU) 104. The four RDUs 100-100C are simply shown for illustration purposes. The system may comprise more or fewer RDUs. In the present embodiment, the RTU 104 communicates with a remote computer such as the host computer 110 over a communications link 106. The communications link 106 may comprise any communications system such as a radio communications link, a modem/telephone line link, a fiber optic link or any other communications link.

The Remote Data Units

Figure 2:
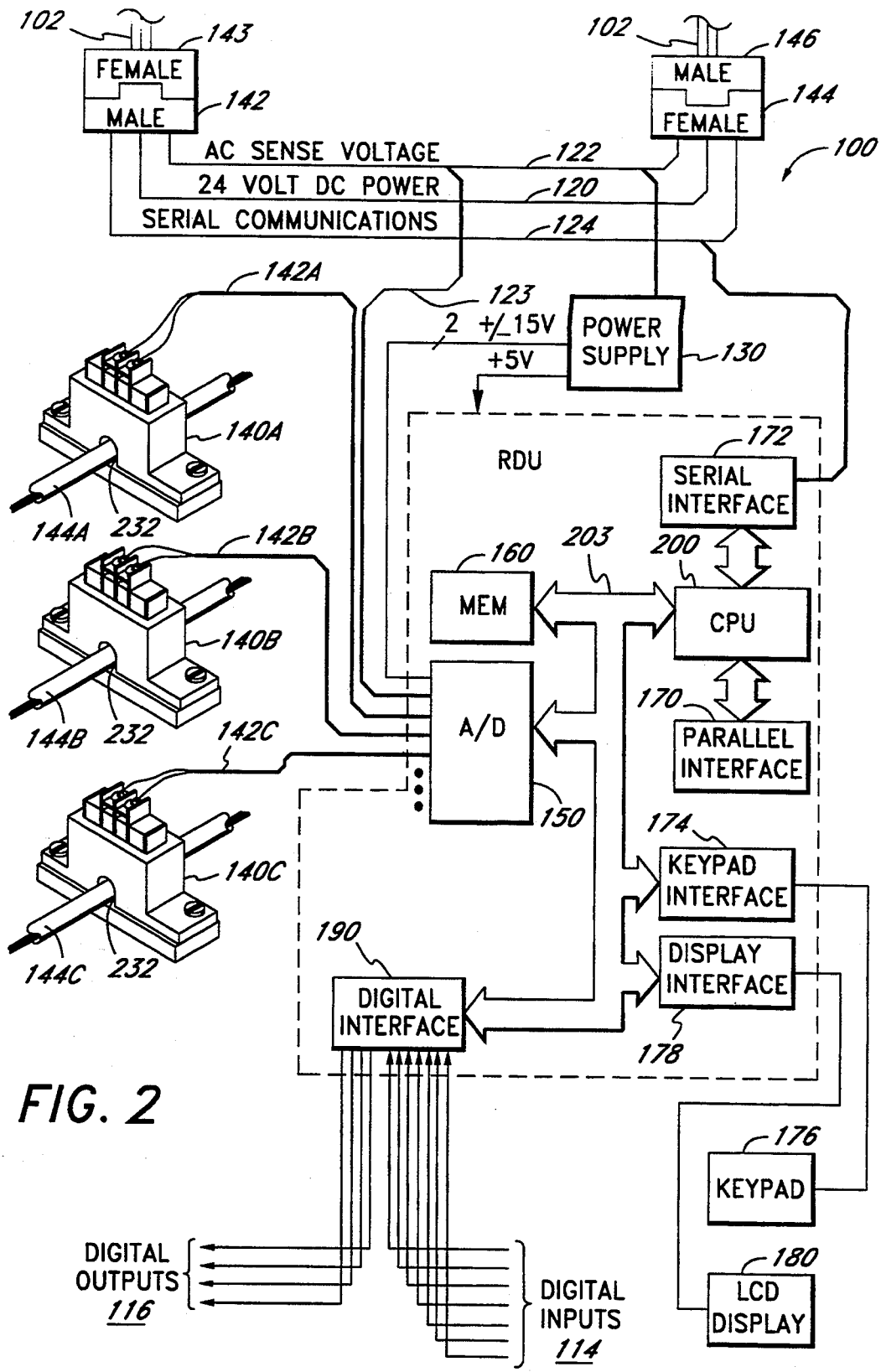
FIG. 2 a functional block diagram of an exemplary remote data unit (RDU)
Figure 4:
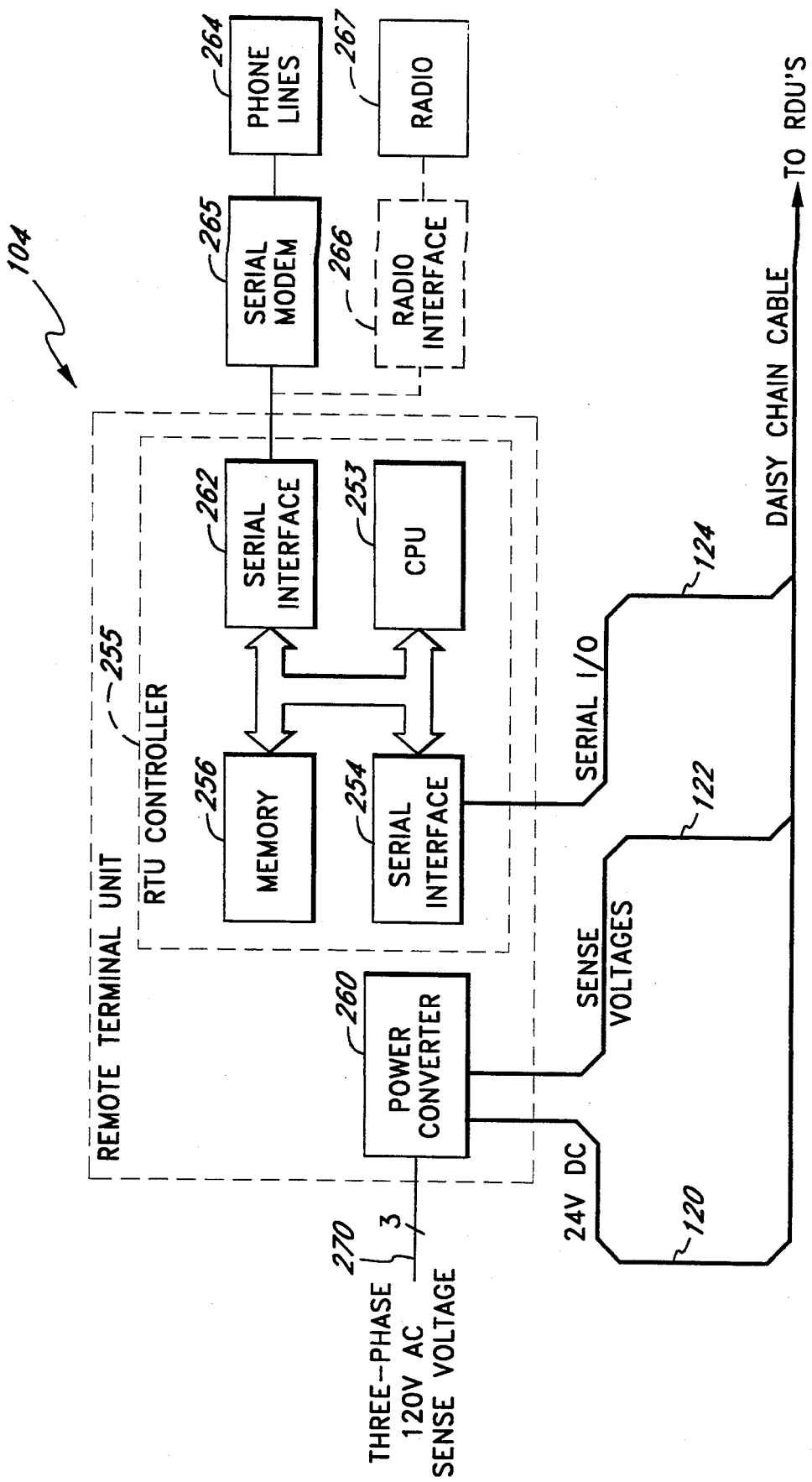
FIG. 4 is a block diagram of an exemplary substation remote terminal unit (RTU).

A functional block diagram of an individual remote data unit (RDU) 100 is shown in FIG. 2. Further references to RDU(s) 100 includes any of the RDUs 100-100C. The RDU comprises a microprocessor based controller with control and data acquisition capabilities. The RDU 100 samples scaled down analog voltage and current signals proportionally corresponding to values in power equipment, and determines values for the power factor, watts, volt amperes reactive (vars), voltage and amperes for the respective power equipment.

The RDU 100 shown in FIG. 2 illustrates the structure for each of the RDUs 100, 100A, 100B, and 100C of FIG. 1. The RDU 100 comprises a power supply 130, which provides +5 and +/−15 volts DC for other elements in the RDU 100, a multi-channel analog to digital (A/D) converter 150, a RAM 160, an EPROM memory 161, a serial interface 172 and a parallel interface 170. A microprocessor based central processing unit (CPU) 200 provides control for the RDU 100, and a memory mapped digital input/output (I/O) interface 190 provides further monitoring and control capabilities for the substation on the digital input lines 114 and the digital output lines 116. Split-core, clamp-on current transformers (CTs) 140A, 140B, 140C, provide analog current sense signals on lines 142A, 142B, 142C to the A-D converter 150. Further references to CT(s) 140 includes any of the CTs 140A-140C in the system. The RDU 100 has a memory mapped keypad interface 174 coupled to a 12-key keypad 176, and a memory mapped display interface 178 coupled to a 2-line liquid crystal display 180. The keypad 176 is used in conjunction with the display to make selections and to enter or change configuration information for the RDU as described herein.

Each RDU can be assigned an address within the daisychained RDUs 100, 100A, 100B, and 100C (FIG. 1). The keypad 176 can be used to select the address field and then input the address or change the address. In the present embodiment, the keypad 176 comprises a 12-key keypad similar to those used in telephones. Namely, the keypad 176 has the following keys in the same arrangement as a telephone keypad: "0", "1", "2", "3", "4", "5", "6", "7", "8", "9", "*" and "#". In the present embodiment, the keys perform the following functions:

| KEY | FUNCTION |
| --- | --- |
| 1 | Home Key: moves cursor to first field |
| 2 | reserved for future use |
| 3 | End Key: moves cursor to last field |
| 4 | moves cursor to next major field to left |
| 5 | reserved for future use |
| 6 | moves cursor to next major field to right |
| 7 | moves cursor left within selected field |
| 8 | increases value at cursor |
| 9 | moves cursor right within selected field |
| 0 | decreases value at cursor |
| * | steps through various displays |
| # | Enter Key: stores value entered and displayed |

The daisy chain cable 102 advantageously comprises an 18-twisted pair cable with overall shield rated at 600 volts. The daisy chain cable 102 carries signals for the RDUs 100-100C on a 24-volt DC power input source signal lines 120, low voltage (e.g., 0-5 volts) AC sense signals from the RTU 104 on signal lines 122, (advantageously, the RTU 104 transforms the power equipment voltages to stepped-down sense signals representative of the AC line voltage), and serial communications interface signal lines 124 for communications over, advantageously, a conventional RS-485 multidrop link. The daisy chain cable 102 is connected to each RDU 100 via a quick disconnect female connector 143 and leaves the RDU 100 via a similar male connector 146. The RDU has corresponding male and female connectors 142 and 144. Advantageously, these connectors comprise D-subminiature, 37-pin male and female connectors available from Cinch Corp. of Oak Grove Village, Ill. This daisy chain approach allows each individual RDU 100 to be removed from service for testing or repair without impacting on the operation of the remainder of the system or the power substation. Each RDU 100 can be removed by simply powering down the control system and disconnecting the male and female connectors 146 and 143 respectively from the RDU 100 and reconnecting the respective female and male connectors 143 and 146 without the RDU 100 which has been removed.

The 24-volt DC power from the RTU 104 on line 120 serves as a power source for the power supply 130 which comprises conventional +/−15 volt and +5 volt power supplies. The power supply 130 distributes power throughout the RDU 100. A number of AC sense signals also enter the RDU 100 on signal lines 122. For instance, if there is one three-phase power transmission or distribution line in the substation, then the signal lines 122 carry three low-voltage AC sense signals, one corresponding to each phase of the power equipment. Advantageously, all of the power and voltage sense signals are metal oxide varistor (MOV) protected.

The A/D converter 150 accepts analog inputs from multiple channels. In the present embodiment, the A/D converter 150 has eight input channels. The low voltage sense signals from the RTU 104 enter the A/D converter 150 via signal lines 122. The A/D converter 150 converts the sense signals to digital form upon request by the CPU 200. The A/D converter 150 has a first-in, first-out buffer which serves as temporary storage for samples from the A/D input channels. The digitized values are read by the CPU 200 from the A/D FIFO via a conventional data bus 203 connecting the A/D converter 150 to the CPU 200. An NEC V25-Plus microprocessor controls the CPU 200 operations. The CPU 200 also includes a real time clock (not shown). In the present embodiment, the EPROM 161, connected to the CPU 200 via the conventional data bus 203, comprises 32K bytes of EPROM (erasable programmable read only memory), and the RAM 160 comprises up to 256K bytes of CMOS (complementary metal oxide semiconductor) memory. A real time clock (not shown) generates 1 second interrupts for the CPU 200. These components are well understood in the art.

Each RDU 100, although structurally identical, is unique in the daisy chain after it is configured with an associated address. The keypad 176 is used to select a unique address for the corresponding RDU 100. The CPU 200 stores the address in the CMOS RAM 160.

The clamp-on CTs 140, as depicted in FIG. 3 and 3a, comprise a housing constructed of plastic or other composite material, and a split-core current transformer within the housing. Advantageously, the housing is generally rectangular in shape and approximately 1.2 inches wide, 1.5 inches high and about 3.5 inches long. The housing has a detachable base plate 214, a main body portion 216, and two connectors depicted in this embodiment as screws 224, 226 each with corresponding pressure plates 228 and 230. One of the connectors is marked with a polarity marking 231 which indicates the positive terminal of the CT 140. The main body portion 216 is approximately 2.5 inches long, 1.4 inches high, and 1.2 inches wide. At the base of the main body portion, two extending portions 234 and 236 provide a baseplate mounting surface.

These extending portions 234 and 236 extend from the base of the main body portion 216 such that the overall length of the main body portion 216 plus the extending portions 234 and 236 is approximately 3.5 inches. Each extending portion 234, 236 has an aperture 240 and 241 adapted to receive screws 242 and 243, respectively which are preferably positioned through the base plate 214. Each of the screws 242 and 243 has a corresponding thumb nut 244 and 245 respectively.

Each main body portion 216 also has semi-circular channel 232 defined at the base, and extending across the width, of the main body portion 216. As seen in FIG. 3a, the main body portion 216 houses the secondary side of a split-core current transformer 246 with a dynamic range of 0–10 amps and an overall repeatable accuracy of better than 1% over the operating range in the present invention. The channel 232 is formed about the core of the secondary of the current transformer. Advantageously, when operational, the split-core current transformer steps down the current by a factor ranging from approximately 10,000:1 to 2,000:1. Other scaling factors are also suitable depending upon the signals desired from the CTs for particular applications. Advantageously, the current is stepped down sufficiently in the split-core transformer 246 so as keep the current low enough to avoid overloading the protection circuit current transformer. However, even when the current is stepped down into the 0–0.5 mA operating range for the output of the split-core current transformer, the 1% repeatable accuracy is maintained.

A cover 247 is placed within the main body portion to protect the transformer 246 as depicted in FIG. 3.

The detachable base plate 214 is planar and is detachably mounted to the base of the main body portion 216. Advantageously, the detachable base plate is approximately 5 inches long, 0.375 inches thick, and 1.2 inches wide. The base plate 214 has, advantageously, a planar conductive plate 238 embedded within and along the detachable base plate 214 in a cavity in the base plate 214 adapted to receive the conductive plate 238. In a preferred embodiment, the conductive plate 238 is mounted with a spring 239 positioned in the cavity in the base plate 214 between the conductive plate 238 and the base plate 214. The conductive plate 238 is held in place with pins 248 which pass through the conductive plate 238 at each end of the conductive plate 238. In the preferred embodiment, the face of conductive plate protrudes above the surface of the base plate 214 when the base plate is not attached to the main body portion 216. With this configuration, the conductive plate maintains a snug fit to complete the split-core transformer 246 when the base plate 214 is attached to the main body portion 216 of the housing. Moreover, in a preferred embodiment, an insulating layer 249 of non-conductive material is positioned around the edge of the conductive plate 238 within the cavity in the base plate 214. When the base plate 214 is attached to the main body 216 of the housing, the conductive plate 238 completes the core of the split-core current transformer 140. In one embodiment, the base plate 214 has apertures which may be threaded and adapted to receive the screws 242 and 243 respectively to attach the base plate 214 to the main body portion 216. When the base plate 214 is attached to the main body portion 216, it extends beyond each extending portion 234, 236 so that the base plate 214 can be independently attached to a mounting surface by the use of the apertures 250 and 252.

Advantageously, the current sense signals from the CTs 140A–140C are protected with a back-to-back diode configuration well understood in the art. For instance, in a preferred embodiment, a conventional transient overvoltage suppressor (not shown), such as a Motorola IN6386 Zener Overvoltage Transient Suppressor, is positioned within the housing 214 and connected between the two connectors.

A wire passing through the aperture 232 functions as the primary for the current transformer when the base plate 214 is attached to the main body portion 216. Exemplary split-core current transformers suitable for use within the housing are manufactured by AEMC Instruments corp., Boston, Mass. (CT parts kit #1031.03).

As described, the clamp-on CTs 140A–C are small and are very accurate even though the output currents advantageously range from 0–0.5 mA in the present embodiment.

As briefly explained above, at each power substation there is generally power equipment which delivers electrical power. The various types of power equipment are usually protected for overload and fault conditions by monitoring the current in the equipment. A typical method of monitoring this current is with a current transformer which steps down the current in the primary (normally in the range of 100 to 3000 amps) to a secondary current in the range of 5 amps. The secondary current is monitored with protection equipment, usually involving transducers installed in one leg of the secondary of the protection circuit current transformer. This generally requires cutting into one leg of the secondary of the protection circuit if the substation is being retrofitted. Although this process is time consuming as explained above, it continues to be the conventional method for substation monitoring of high-power, power equipment. Applicant recognized that this method could be greatly simplified.

The clamp-on CTs 140 described connect easily to one leg of the secondary side of the protection circuit current transformer connected to each phase of the power equipment. To attach the clamp-on CT 140, an installer removes the detachable base plate 214, positions one leg 144A, 144B or 144C (FIG. 2) of the protection circuit within the channel 232, and re-attaches the detachable base plate 214. The substation need not be taken off-line and the protection circuit need not be cut. This allows for quick, safe, and efficient installation and repairs. Therefore, the transducers of conventional monitoring systems need not be installed in the secondary of the protection circuit. Accordingly, installation of the clamp-on CTs 140 of the present invention substantially improves upon the more difficult, time consuming, and dangerous installation of the transducers used in conventional systems. Moreover, even though the CTs 140 are split-core devices which monitor current flowing in a conductor without cutting into the wire, and even though the CTs step down the current detected significantly (e.g., to the 0–0.5 mA operating range in the present embodiment), the Applicant designed the present invention to provide accurate information about the power flow through the power equipment. The manner in which the accuracy is maintained is further explained herein.

Once the CTs 140A–C are installed, the legs 144A–C of the protection circuit passing through the aperture 232 function as the primary for the CTs 140A–C. Thus, a current, scaled down (by a factor of 10,000 in the present embodiment) corresponding to current detected in the protection circuit is provided to the secondary of the transformer via the connectors of the CTs.

A detectable voltage is provided by connecting a resistance (e.g., effectively 2 kohms in the present embodiment) in series with the secondary of the clamp-on CTs 140A–C (e.g., attaching a resistor between the two connectors). Upon installation, the analog voltage signals from the CTs 140A–C are calibrated by using a potentiometer (not shown) to maintain the 1% repeatable accuracy in the system. The analog voltage signals from the clamp-on CTs 140A–C are provided to the A/D converter 150 which converts the voltages into digital form upon request from the CPU 200. The CPU 200 reads the digitized signals from the conventional data bus 203 as previously explained. Because the resistance across the clamp on CT 140A–C is known, the current corresponding to the measured voltage is calculated as well understood in the art.

The RTU

The remote terminal unit (RTU) 104 functions as the system controller in the present embodiment and performs the following primary functions: poll the RDUs 100 for data, transform the AC power equipment voltages to low voltage AC sense voltages, communicate with a remote computer such as the host computer 110 and provide the remote computer with the data obtained from the RDUs 100 upon request.

Advantageously, the RTU 104 is based around a computer controller 255. The RTU 104 hardware comprises a microprocessor based (i.e., an NEC V25-Plus) controller 255 with a CPU 253, real time clock (not shown), serial communications channels each with a dedicated serial interface 254, 262, a memory module 256, at least one parallel port (not shown) and a conventional step-down power converter 260. The serial communications channels utilize appropriate dedicated serial interfaces 254 and 262. One serial interface 254 connects the RTU 104 to the RDUs 100 via a shared conventional RS-485 link. The serial interface 262 is used to communicate to either an external modem 265, which in turn connects to telephone lines 264 to communicate with the host 110 as well understood in the art, or to a radio interface 266, which in turn connects to a radio 267 to communicate with the host. An exemplary radio communications link interface advantageously comprises a Metricom Packet Radio Controller which connects to a Metricom transceiver. Those skilled in the art will appreciate that other communications links are also appropriate and do not detract from the subject matter regarded as invention.

In the present embodiment, the memory module 256 advantageously comprises an EPROM, which is used for program execution, and a CMOS static RAM, which is used for configuration storage and is well understood in the art.

The step-down power converter 260 converts AC line voltages on signal lines 270, which are usually already stepped down somewhat from either a 4 kilovolt or 16 kilovolt (phase to ground) range of the power equipment, to low voltage (e.g., 0–5 volt) sense voltages. The RTU 104 provides these sense signals on signal lines 122 to the RDUs 100–100C, via the daisy chain cable 102, one pair of wires for each sense voltage. The power converter 260 also provides the 24-volt DC power for the RDUs 100 on signal lines 120 of the daisy chain cable 102.

An A/D converter (not shown) similar to that of the RDU 100 can also be included in the RTU 104 for converting analog data into digital form.

System Firmware

FIGS. 5a–5c and FIGS. 9a–9c are flowcharts of operations carried out by each RDU 100. The RTU 104 can also perform the same functions, but generally leaves these functions to the RDUs 100–100C. In general, the RDUs 100–100C acquire sample data representing values for voltage and current for a respective power equipment line, analyze the data, and transmit the data to the RTU 104 upon request. The RTU 104 performs primarily the functions of obtaining data from the RDUs 100–100C and for communicating with the remote computer 110.

Configuration

During configuration operations, as represented in action block 280 (FIG. 5a), a user inputs configuration information via the keypad 176. This information is stored in the CMOS RAM 160 of the RDU 100. The RTU 104 executes the same functions. Thereafter, during normal operations, the RDUs 100 and the RTU 104 read their configuration information from their respective memories. For instance, during configuration, the unique address is entered for each RDU. During operation, when a communication request is made to, or a transfer is executed by, these devices, the RDU or RTU as the case may be checks its address. An RDU 100 or RTU 104 will only respond to serial communications requests with addresses that match the addresses input for that RDU 100 or RTU 104.

The keypad 176 is also used to input configuration information about the type of power equipment line which is monitored by the RDU 100. For instance three-phase or single phase, clockwise or counterclockwise, and phase-to-neutral or phase-to-phase monitoring, as depicted in Table 1.

TABLE 1

| DESCRIPTION |
| --- |
| 3 phase, CW & CCW, P-N |
| 3 phase, CW, P-P |
| 3 phase, CCW, P-P |
| 1 phase, CW, P-N |
| 1 phase, CW, P-P |
| 1 phase, CCW, P-N |
| 1 phase, CCW, P-P | where:
CW = ABC clockwise; CCW = ABC counterclockwise
P-P = phase-to-phase; P-N = phase-to-neutral To configure each RDU 100, the user steps through the fields with the keypad 176 and display 180 to select the proper power equipment line. Each field is stored in the CMOS RAM 160 when the user presses the Enter Key (i.e., the "#" key in the present embodiment) on the keypad 176. The RDUs 100 use this configuration information during subsequent operations as later explained.

The RDUs 100 can also receive correction offset values for phase differences computed for each current-voltage pair as explained herein. These offsets correct for system bias or other factors specific to a given RDU 100. These values are input via the keypad 176.

Because the RDU 100 scales all data it collects into engineering units (e.g., amps and volts), it also receives scaling factors for this operation which are downloaded from the host 110 via the RTU 104. The RDU 100 stores all this configuration information in the CMOS memory 160 for further reference during subsequent operations.

Data Collection and Analysis by the RDU

Once configuration of the RDUs 100 and the RTU 104 is complete, the RDUs 100 begin data collection and analysis.

In the present embodiment, the A/D 150 continuously samples the 0–5 volt sense signals on signal lines 123 (representing line voltages) and the signals from the clamp-on CTs 140A–C (representing the line currents) for all three phases in a three-phase power line. Approximately 960 times a second, the CPU 200 sends a trigger pulse to the A/D 150 causing it to take one sample each from all of its input channels. Typically, for a three-phase installation, there would be six input channels corresponding to current and voltage for each of the three phases. The channels are actually sampled consecutively, but the delay between sampling one channel and sampling the next channel is so short that all of the channels may be regarded as effectively having been sampled simultaneously. As the A/D 150 collects each sample value it appends it to the end of an internal first-in, first-out buffer (the "A/D FIFO"). As soon as it has collected and stored one sample from each channel, the A/D 150 stops collecting samples until the next trigger pulse is received; and the A/D 150 generates an interrupt for the CPU 200, indicating that a fresh set of samples is now available for processing.

The exact sampling rate of the A/D 150 is controlled by changing the rate at which the CPU 200 generates the trigger pulses. That rate, expressed in pulses per second, is always equal to 768000 divided by 1 plus the value stored in a Special Function Register within the CPU 200, call the Timer Modulus Register (TMR). For example, if the current value in the TMR is 799, then exactly 768000/(1+799)=960 trigger pulses will be generated per second. Incrementing the value in TMR slightly decreases the sampling rate of the A/D 150, and decrementing the value in TMR slightly increases the sampling rate.

Figure 9A:
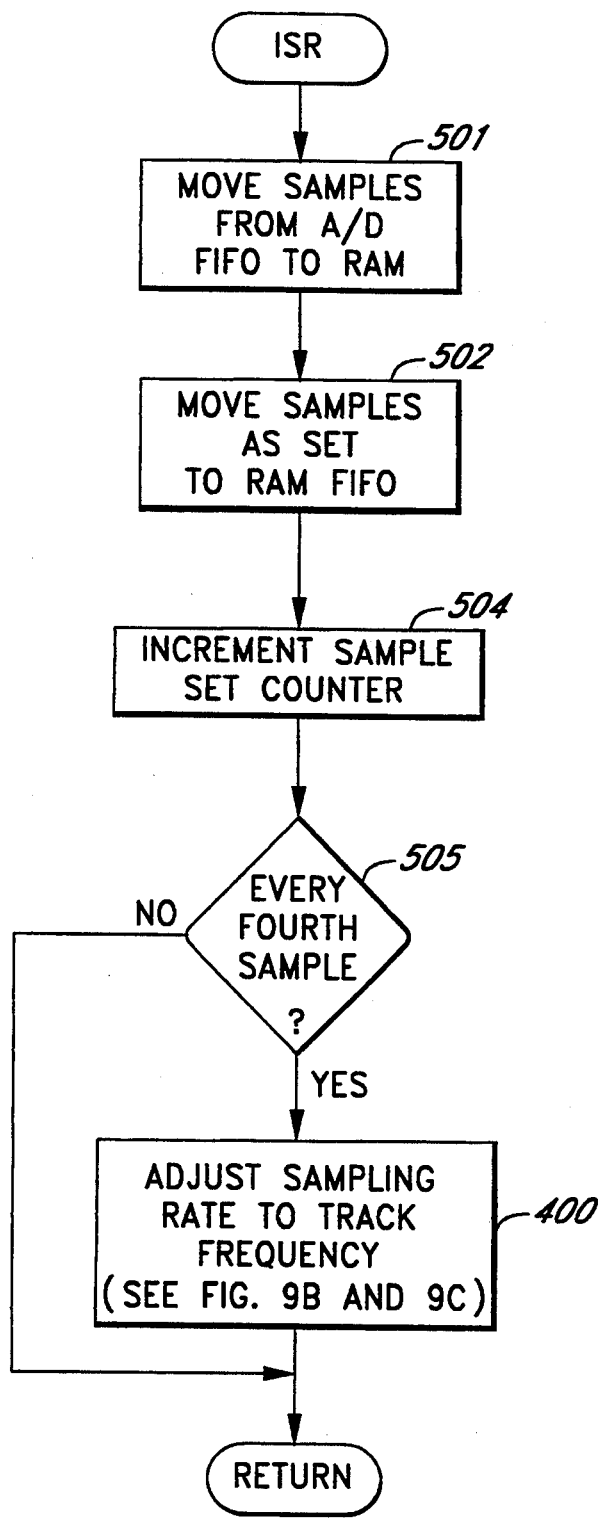
FIGS. 9a, 9b and 9c are exemplary flowcharts for the data collection and frequency tracking interrupt service routine of the system firmware of the RDU.
Figure 9B:
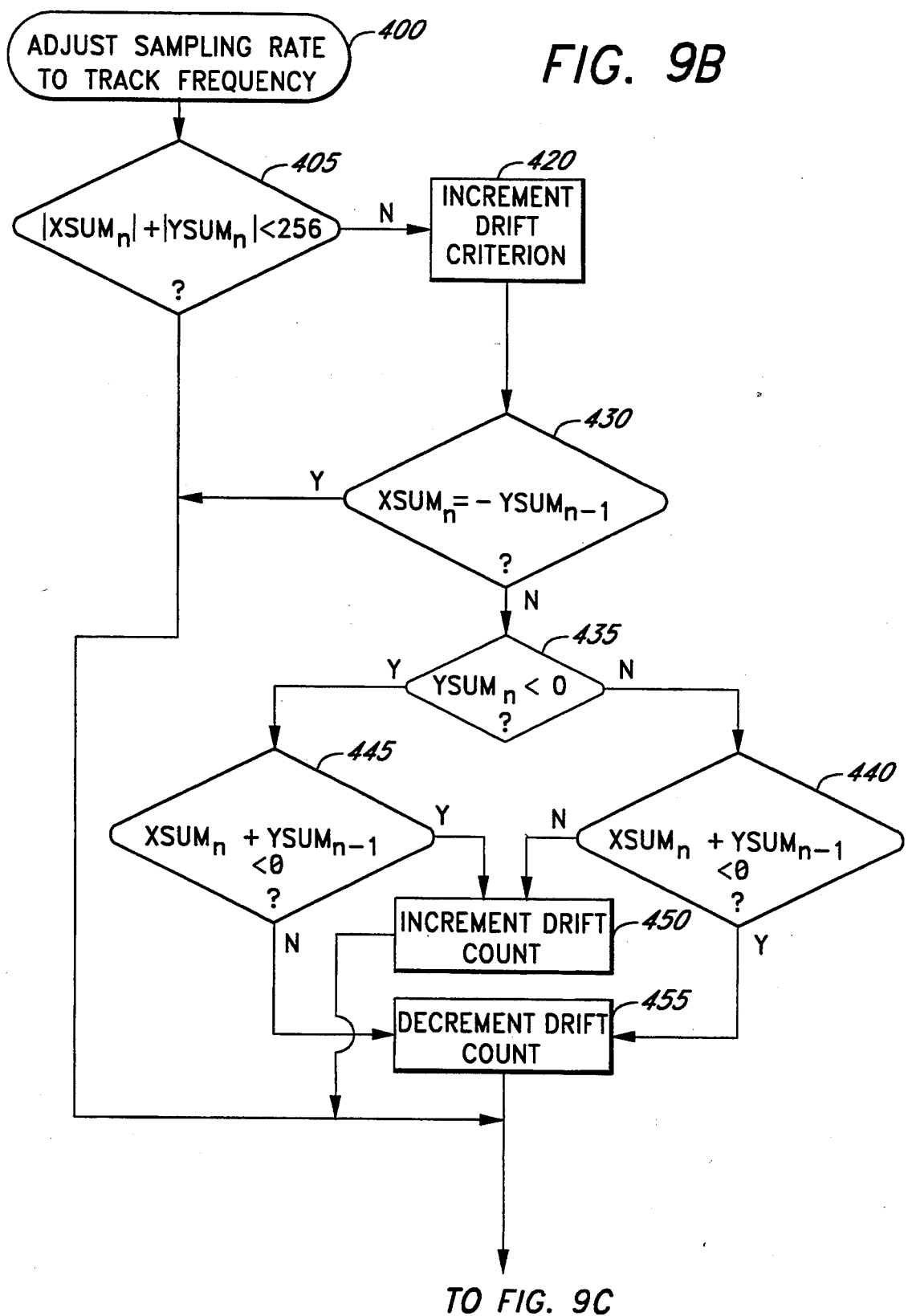
Figure 9C:
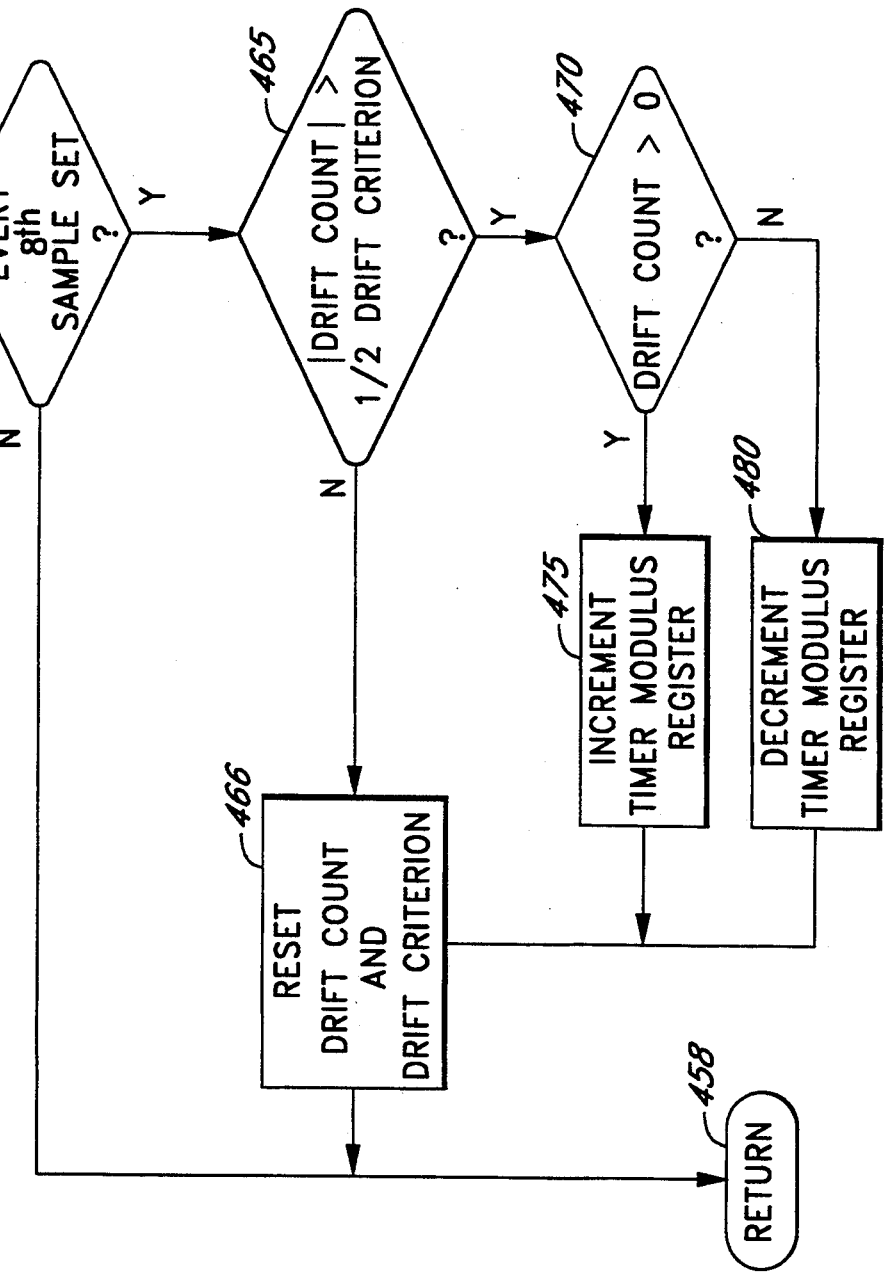

When the CPU 200 receives an interrupt from the A/D 150, it immediately enters an interrupt service routine (ISR) illustrated in FIGS. 9a–9c. The ISR first copies the sample values from the A/D FIFO into a temporary buffer in the RAM 160, removing them from the A/D FIFO in the process, as represented in an action block 501. Each raw A/D sample is actually a packed combination of a 3-bit A/D channel identifier and a 12-bit sample value. The ISR checks the channel identifier of each sample to ensure that the identity of each sample is correctly known, and then removes the channel identifier, leaving only the 12-bit sample value. As represented in an action block 502, the sample values are appended, as a set, in fixed order, to the end of a large first-in, first-out buffer (the "RAM FIFO") in the RAM 160 for subsequent additional processing by the CPU 200 at non-interrupt level. Use of the RAM FIFO ensures that all sample values will be eventually processed even if they are collected when the CPU 200 is momentarily executing other tasks.

As the ISR appends each set of new sample values to the RAM FIFO, it increments a SAMPLE SET COUNTER, as represented in an action block 504. The main routine uses the SAMPLE SET COUNTER to determine when there is sample data waiting in the RAM FIFO for additional processing.

In the present embodiment, every fourth set of samples is used to track the frequency of the monitored sine waves. Therefore, while still executing the ISR, the CPU 200 next determines if the sample set just processed was a fourth sample set, as represented in decision block 505. If it is a fourth set of samples, the CPU 200 proceeds to adjust the sampling rate to track the frequency, as represented in an action block 400, and as further described herein with reference to FIGS. 9b and 9c.

Analog-to-Digital Data Processing Using the DFT

Typically, the data sampled from the A/D 150 represents real time signals from AC sine waves for current and voltage. Current and voltage sine waves from the same power line are related by the phase relationship between these sine waves. The determination of an accurate phase relationship involves a number of steps according to the present invention. First, the "absolute phase" of the individual sine waves is determined. For purposes of this description, absolute phase of a sampled sine wave is defined as the instantaneous phase at the moment when the first sample was taken of the wave during any 0.10 second window of samples. Then, the relative phase between two sampled sine waves is determined. This process is further explained below.

Generally speaking, a DFT is applied to a sequence of sample values taken in equal time intervals from a given periodic analog waveform. The amplitude of each sample and the time elapsed between each sample and the first sample taken in the sequence may be used to completely characterize the present sample.

Theoretically, any collection of N sample values can be synthesized by adding N/2 component sine waves having the appropriately chosen amplitude, frequency, and initial phase, and subsequently sampling the resultant complex waveform at the same rate as the original given waveform was sampled. The DFT allows one to derive each of the N/2 component sine waves (i.e., to find the amplitude, frequency, and initial absolute phase of each component sine wave individually), which would be used to synthesize the sequence of samples described above.

The exact frequencies of each of the N/2 component sine waves is determined by the length of time in which the sequence of N samples is taken. The frequency of the component sine wave having the lowest frequency (i.e., the fundamental frequency) is one cycle within the length of time that the N samples are taken. Thus, if the N samples are taken in 1/10th of a second, then the frequency of the fundamental component sine wave will be one cycle per 1/10th second, or 10 Hz. Each of the other component sine waves (called harmonics) will have frequencies which are integer multiples of this fundamental frequency. Thus, in the example given, the next lowest frequency would be 20 Hz, the next 30 Hz, and so on until the highest frequency of N/2*10 Hz is reached.

The DFT provides a simple algorithm for computing the amplitude and the phase of any single one of these N/2 component sine waves. In a preferred embodiment of the invention, the number of samples analyzed and the spacing between the analyzed samples is selected so that the monitored component is a 60 Hz wave. Although both the amplitude and the phase may be calculated by means of the DFT, the DFT is employed in accordance with the teachings of the present invention with respect to finding the phase of the component sine wave of interest.

Absolute Phase Determination

The raw output of a DFT consists of an X coordinate value and a Y coordinate value which may be conceptualized as the X and Y coordinates of a point on a circle having its center at the origin (i.e., where the X-axis meets the Y-axis). Because the absolute phase of the component sine wave of interest corresponds to the angle between the Y-axis and the straight line drawn from the origin to the coordinate (X,Y), the X and Y coordinates indicate the initial starting point of the component sine wave of interest. Thus, the absolute phase of the component sine wave of interest is calculated as the arctangent of the ratio Y/X.

The X and Y coordinate values are calculated from the individual samples. Each of the individual samples is broken up into an "x-part" and a "y-part." All of the x-parts are summed and then this sum is divided by N/2 to obtain the value of the X-coordinate. Similarly, all of the y-parts are summed and this sum is divided by N/2 to obtain the value of the Y-coordinate.

Figure 8A:
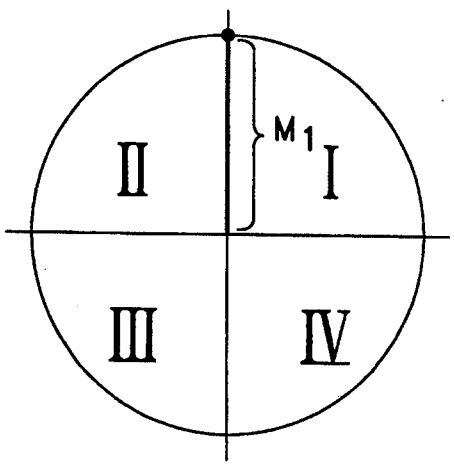
FIGS. 8a, 8b and 8c are conceptual diagrams which aid in the description of the method for calculating the discrete Fourier Transform for a given periodic waveform.
Figure 8B:
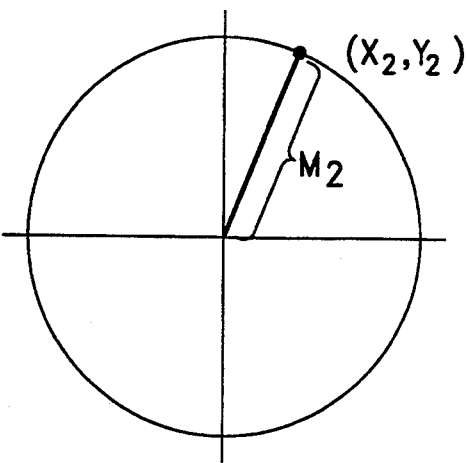
Figure 8C:
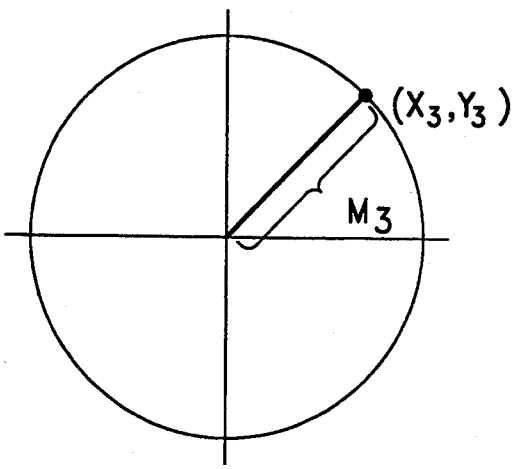

In order to break each individual sample into its x-part and its y-part, the sample is "rotated backwards" (i.e., clockwise) from the vertical (i.e., the Y-axis) within a circle having a radius equal to the sample value (see FIGS. 8a-8c). The angle of rotation is equal to an angle corresponding to the elapsed time between the occurrence of the present sample and the occurrence of the first sample. Thus, to determine the number of degrees that a sample is to be "rotated," one cycle of the component sine wave of interest is assigned a value of 360°, and this value is divided by the number of samples taken in that cycle. For example, if 16 samples are being taken per cycle of the component sine wave of interest, then each sample is spaced (360/16)°, or 22.5° apart (in the embodiment where 960 samples are taken per second, the selection of 16 samples corresponds to an interval of 1/60th of a second-a number of samples sufficient to isolate the 60 Hz component sine waves).

Therefore, the first sample (represented in FIG. 8a), which need not be rotated at all, has an x-part equal to zero and a y-part simply equal to the sample value. The second sample (represented in FIG. 8b) is rotated through an angle of $-22.5°$ so that the x-part is calculated to be the magnitude of the sample (M2) times the cosine of 67.5° (90°$-22.5°$) (i.e., M2*Cosine(67.5°)), and the y-part is calculated as the magnitude of the second sample (M2) times the sine of 67.5° (M2*sin(67.5°)). The third sample (represented in FIG. 8c) is rotated through an angle of $-45°$ so that the x-part of the third sample is calculated as the magnitude of the third sample times the cosine of 45° (90°$-40°$) and the y-part of the third sample is calculated as the magnitude of the third sample times the sine of 45°. Each sample is broken into an x-part and a y-part in this manner. In one embodiment of the invention, the system performs a "batch mode" analysis on 96 samples for each A/D input channel at a time (six cycles of the frequency of interest) so that the process described above is performed six times for each A/D input before the relative phase values are tabulated. A variable XSUM is maintained which is the value of the sum of all the x-parts for all six cycles (i.e., 96 samples), while a variable YSUM is assigned the value of the sum of all the y-parts of the 96 samples.

$$XSUM = \sum_{i=1}^{N} x\text{-part}(i)$$

$$YSUM = \sum_{i=1}^{N} y\text{-part}(i)$$

Separate XSUM and YSUM values are calculated for each current and each voltage sample set. The values of the variables XSUM and YSUM may then be used to calculate the absolute phase of the component sine wave of interest. Because the value of the X-coordinate is equal to XSUM/(N/2), and the value of the Y-coordinate is equal to XSUM/(N/2), the ratio between YSUM and XSUM is the same as the ratio between the Y-coordinate and the X-coordinate. Therefore, the absolute phase of the component sine wave of interest may be calculated as the arctangent of YSUM/XSUM.

Relative Phase Determination

In the present embodiment, the relative phase between samples from two channels accepting data from the same phase of the power line is determined by subtracting the absolute phase of the current from the absolute phase of the voltage. If this value is negative, 360° is added to the negative value.

A selected constant, depending on the type of power line and the phase monitored, is added to the result to obtain phase readings which indicate by how many degrees the current sine wave lags the voltage sine wave. The appropriate constants are provided in Table 2 below. The value obtained is also corrected by adding any configuration offsets which can be input using the keypad and display or downloaded from the RTU 104 to the RDU 100 during configuration operations.

TABLE 2

| DESCRIPTION | A PHASE | B PHASE | C PHASE |
|---|---|---|---|
| 3 PHASE, CW & CCW, P-N | 0 | 0 | 0 |
| 3 PHASE, CW, P-P | 330 | 330 | 330 |

TABLE 2-continued

| DESCRIPTION | A PHASE | B PHASE | C PHASE |
| --- | --- | --- | --- |
| 3 PHASE, CCW, P-P | 30 | 30 | 30 |
| 1 PHASE, CW, P-N | 0 | 120 | 240 |
| 1 PHASE, CW, P-P | 330 | 210 | 90 |
| 1 PHASE, CCW, P-N | 0 | 240 | 120 |
| 1 PHASE, CCW, P-P | 30 | 150 | 270 |

CW = ABC clockwise; CCW = ABC counterclockwise
P-N = phase-to-neutral; P-P = phase-to-phase

Computer Execution of Calculations

Figure 5A:
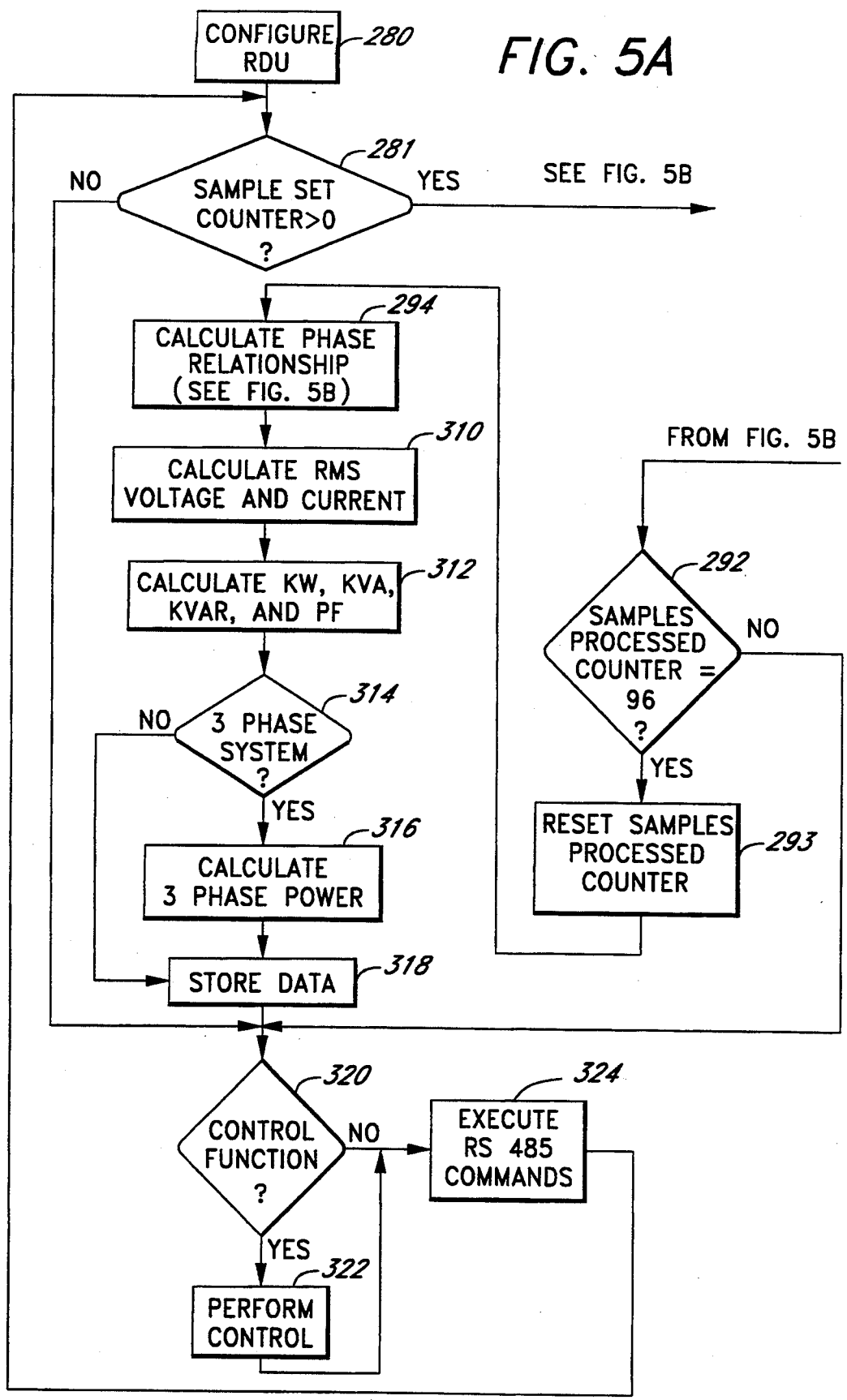
FIGS. 5a, 5b and 5c are exemplary flow charts for the main routine firmware of the RDU.
Figure 5B:
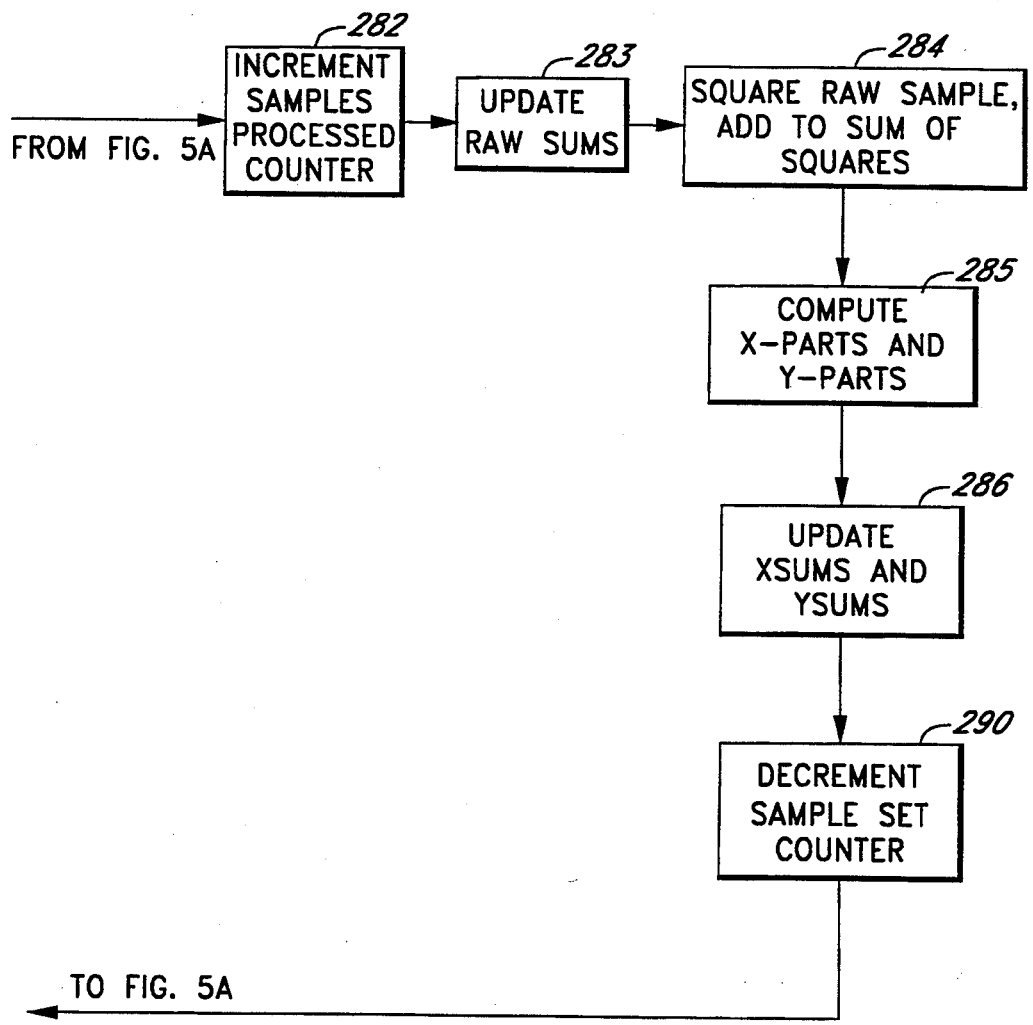
Figure 5C:
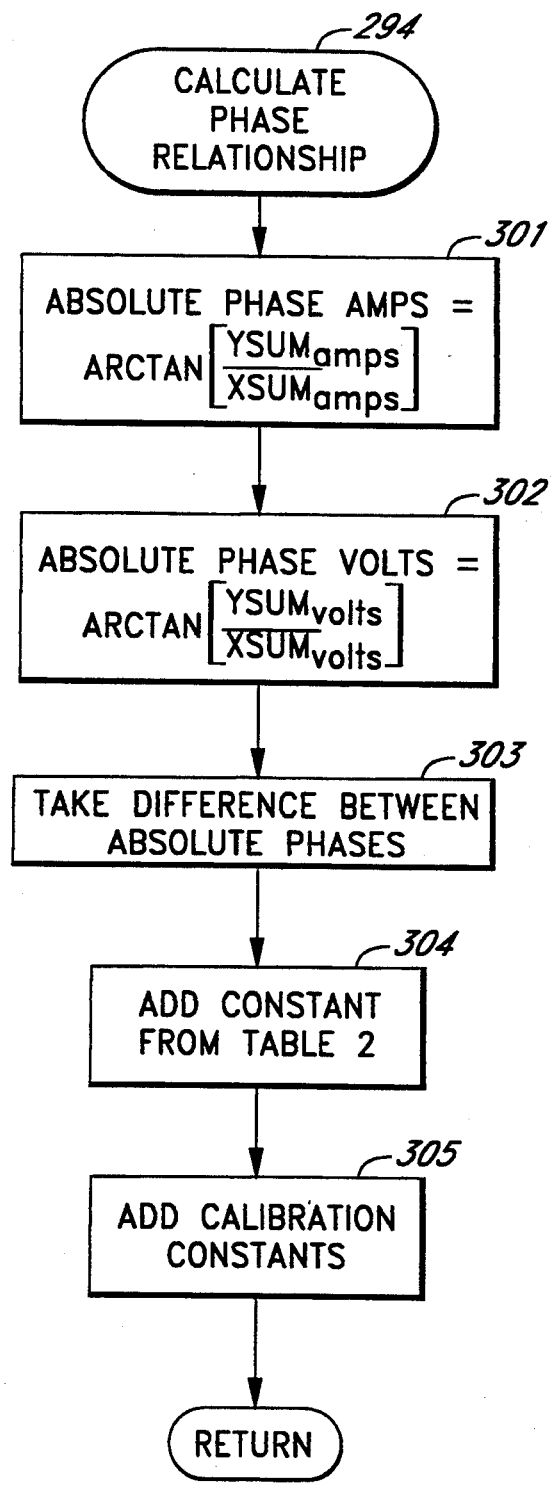

The calculations performed above are executed in the CPU 200 of the RDU 100 in the present embodiment. FIGS. 5a-5c illustrate a main computer routine. After the RDU is configured, as described above, the CPU 200 determines if the SAMPLE SET COUNTER is greater than zero (which indicates that at least one set of six samples—one sample for the current and voltage of each phase in a three-phase power line—has been stored in the RAM FIFO), as represented in a decision block 281. If the SAMPLE SET COUNTER is not greater than zero, control passes to a decision block 320. If the SAMPLE SET COUNTER is greater than zero, the CPU 200 proceeds to update several values, as illustrated in the flowchart of FIG. 5b. First, the CPU 200 increments a SAMPLES PROCESSED counter, as represented in an action block 282 (FIG. 5b). The SAMPLES PROCESSED counter tracks how many sample sets (i.e., sets of six samples for a three-phase power 1thc) have been processed. Next, the CPU 200 updates a running sum of the raw sample values by adding the raw magnitude of each sample value to a corresponding RAWSUM variable (i.e., in the present embodiment, the computer maintains six variables, RAWSUM-1–RAWSUM6, one for the current and voltage for each phase), as represented in an action block 283. Next, the CPU 200 updates six variables which maintain a running total of the sum of squares for the current and voltage of each phase (e.g., SUMSQUARES1–SUMSQUARES6), as represented in an action block 284. This action involves squaring each sample and adding the square to the corresponding variable for that parameter and phase. After the raw sums and the sum of squares values have been updated, the CPU 200 computes the x-parts and the y-parts for all six samples, as represented in an action block 285.

In the present embodiment, this is accomplished by multiplying each sample by integer coefficients from a look-up table in the RAM 160. The values in the look-up table are integer values which relate to the other values in the look-up table according to the same ratio as the cosine and sine of the angles corresponding to the angles of rotation of each sample described above (e.g., 22.5°, 45°, 67.5°, etc.). In other words, instead of calculating the cosine and sine values of the angle assigned to the current sample, as described above, a look up table contains integers which relate in the same ratio as all the possible sine and cosine values for samples spaced apart by 22.5°. For instance, for the second of 16 samples (16 samples per cycle for 60 Hz sine waves sampled at 960 samples/second), the look-up table would store an integer which corresponds to the value of cosine(67.5°) times a constant in order to calculate the x-part for the sample, and an integer which corresponds to the value of sin(67.5°) times the same constant in order to calculate the y-part for the sample. The integer coefficients are used in the present embodiment because the CPU 200 does not have a floating point processor. The actual sine and cosine values need not be used because the ratio between the sum of the x-parts and the sum of the y-parts is all that is needed to obtain the phase.

Once the x-parts and the y-parts are obtained, each is added to corresponding XSUM and YSUM values (e.g., XSUM1–XSUM6 and YSUM1–YSUM6), as represented in an action block 286. These XSUM and YSUM values maintain running sums of the x-parts and y-parts of each sample until 96 samples for the current and voltage for each phase have been processed (i.e., six cycles of 60 Hz sine waves).

In the present embodiment, the CPU 200 also updates a variable which maintains a running sum of the raw values for the current for all three phases in order to calculate the neutral current (i.e., the sum of the current in each of the three phases equals the neutral current). This is accomplished by adding the raw sample values for the current in each of the three phases and adding this value to a neutral current sum NCSUM. The CPU 200 also squares the sum of the raw sample values for the current in each phase and adds this to a sum-of-squares variable which maintains a running total of the sum-of-squares for the neutral current. The neutral current operations are represented in an action block 288. The action blocks 283–290 are shown once for simplification. These actions are actually performed for each current and voltage sample from each phase of the power equipment being monitored.

Next, the CPU 200 decrements the SAMPLE SET COUNTER, as represented in an action block 290. This indicates that the oldest set of six sample values in the RAM FIFO has been processed.

In the present embodiment, the CPU 200 next determines if the running totals maintained in the action blocks 283–290 represent 0.10 seconds of samples (96 samples for each channel to the A/D 150). Since the SAMPLES PROCESSED counter is incremented each time the CPU 200 processes a set of six samples (one sample for the voltage and current for each phase), the CPU determines if the SAMPLES PROCESSED counter equals 96, as represented in a decision block 292.

If 96 samples have not been processed for each A/D channel, then control passes to the action block 320. If 0.10 seconds of samples (96 sample sets) have been processed, the CPU 200 resets the SAMPLES PROCESSED counter, as represented in an action block 293 and proceeds to determine the phase relationship between the voltage and current in each phase of the power line, as represented in an action block 294. The phase relationship calculation is illustrated in greater detail in FIG. 5c.

Because the XSUM and YSUM values for the current and voltage in each phase of the power line are updated as samples are received, the absolute phase for each sinewave is calculated by taking the arctangent of (YSUM/XSUM). The absolute phase of the current is calculated by taking the arctangent of $YSUM_{amps}/XSUM_{amps}$, as represented in an action block 301. This calculation is performed separately for each phase of the transmission line. The absolute phase of the voltage is calculated by taking the arctangent of $YSUM_{volts}/XSUM_{volts}$, as represented in an action block 302. This calculation is also performed for the voltage in each phase of the power line. The CPU 200 then takes the difference between the absolute phases for each voltage and current, as represented in an action block 303. The CPU 200 then adds the appropriate constant listed in Table 2 above to obtain the correct relative phase for each phase in the power line, as represented in an action block 304.

The clamp-on transformers introduce error in the phase detection. Therefore, during configuration, the keypad is used to increase or decrease a correction constant which is applied to the relative phase calculation for each phase. The correction constant is adjusted until the relative phase reading from the monitoring system matches a calibration instrument reading which provides the actual relative phase for each phase on the transmission line. The correction constant is applied to the relative phase, as represented in an action block 305.

Frequency Tracking Using Continuous DFT

As stated above, precise determination of both the absolute phase and the amplitude of the component sine wave which is being analyzed requires that a whole number of samples are taken for each cycle of the component sine wave of interest. However, the actual frequency of the monitored waveform often varies by slight amounts so that the accuracy of the DFT may be compromised. The present invention therefore incorporates a method (represented in the action block 400, and described in greater detail with reference to the flowchart of FIGS. 9b and 9c) of monitoring the actual frequency of the component sine wave of interest and adjusting the sampling rate accordingly to insure that an integer number of samples are taken each cycle.

It should be noted here that it has been found that computation associated with frequency tracking is significantly simplified by using only the voltage component and not the current component of the monitored waveforms. Thus, in the present embodiment, only the 3 phases of the monitored voltage signal received on the line 123 are used to track the frequency of the waveform.

The method of frequency tracking employed in accordance with the present invention uses four equally spaced samples per cycle of the component sine wave of interest. Thus, in the case where 16 samples are taken per cycle of the component sine wave of interest, the first, fifth, ninth, and thirteenth samples would be used for the purposes of frequency tracking. This operation is represented in the decision block 505 of FIG. 9a, as described above.

For the four samples per cycle, a DFT is calculated for frequency tracking by rotating each sample counterclockwise by a multiple of 90°. This simplifies calculations significantly since the x and y-parts of each sample are simply equal to zero, or plus or minus the sample value as shown below in Table 3.

TABLE 3

| Rotation | x-part | y-part |
| --- | --- | --- |
| 0° | 0 | $S_1$ |
| −90° | $S_2$ | 0 |
| −180° | 0 | $-S_3$ |
| −270° | $-S_4$ | 0 |

The computation of XSUM and YSUM for four samples of data (S1 to S4) thus reduces to:

XSUM = $S_2 - S_4$

YSUM = $S_1 - S_3$

In the present embodiment, frequency tracking is performed in real time in the interrupt service routine (ISR) so that the next DFT update results in a new pair of values for XSUM and YSUM as soon as the fifth sample is taken. With reference to TABLE 3, the new values of XSUM and YSUM may be calculated as:

XSUM = $S_3 - S_5$

YSUM = $S_2 - S_4$

From this example it is clear that the next YSUM value in each successive frequency tracking DFT update equals the previously calculated XSUM value. In a similar manner, the next XSUM value is calculated from the previous YSUM by simply adding the value of the new sample (S5), subtracting the value of the first sample (S1), and negating the result. Once the XSUM and YSUM values have been updated, these values may be used to track the frequency of the component sine wave of interest to insure that a whole number of samples are taken per cycle.

The method of frequency tracking employed in accordance with the present invention is described with reference to the flowchart of FIG. 9b and 9c. The operations represented in this flowchart are repeated for each phase in the power line. The flowchart begins in a start block 400 and control passes to a decision block 405 wherein a test is performed to determine if the sum of the absolute value of the current XSUM and the absolute value of the current YSUM is less than 256. This test is a reliable means of indicating whether or not a signal is present on the input line 122. If the addition of the absolute values of XSUM and YSUM yields a value less than 256, then the system assumes that no input signal is present for the present monitoring cycle. Control then passes to a decision block 415 (FIG. 9c), which will be discussed in greater detail below. If the addition of the absolute values of XSUM and YSUM yields a value greater than or equal to 256 (decision block 405), then this indicates that a signal is detected.

The value of 256 stems from the use of a two-byte integer variable in the present embodiment to store the sum of the absolute values of the XSUM and YSUM values. The check is preferably accomplished merely by a test on the upper byte of the two-byte variable. If the value of the sum of the absolute value of XSUM and YSUM equals or exceeds 256, the upper byte of the two-byte variable storing the sum will be greater than zero. If the upper byte of the two-byte variable is zero, this indicates that no signal is present on the power line represented by the XSUM and YSUM variable at this point. If the value equals or exceeds 256, control then passes from the decision block 405 to an action block 420 wherein a counter "DRIFT CRITERION"0 (which initially has a value of zero) is incremented. DRIFT CRITERION tracks how many samples have been collected that exceed the threshold in decision block 405.

Once DRIFT CRITERION is incremented, control passes to a decision block 430 wherein a test is performed to determine if the new XSUM (denoted as "$XSUM_n$" in FIG. 9b) is equal to negative the value of the previous YSUM (denoted "$YSUM_{n-1}$" in FIG. 9b). As explained above, each update of XSUM is computed by taking the previous YSUM, subtracting from it the value of the sample collected one cycle previously, adding to it the value of the sample just collected, and then negating the result. If the AC voltage being monitored is remaining constant, and if the sampling rate is correct, then the values of the subtracted sample and the added sample should be equal. Therefore, after negating that result, the new XSUM (which was just computed) should equal the negative of the previous YSUM. If this is actually the case, then it is assumed that the present sampling rate is correct, and control passes from the decision block 430 to the decision block 415 (FIG. 9c). Otherwise, control passes from the decision block 430 to a decision block 435.

If the new XSUM is not equal to negative the value of the previous YSUM, then the subtracted sample and the added sample must not have been exactly equal. There are several possible explanations for this occurrence. First, there is typically a small amount of random "noise" which introduces small errors into the analog-to-digital conversion process. Second, the AC voltage on the power line being monitored may have increased or decreased since the previous cycle. A third possibility is that the analog waveform being sampled is not a pure sine wave. Finally, the samples may be being collected either too quickly or too slowly, in which case either more or less than one cycle transpired between when the subtracted sample was collected and when the added sample was collected.

Determining which of the possibilities accounts for a given instance of the new XSUM not being equal to the negative of the previous YSUM is impossible. If it could be determined that an incorrect sampling rate was the cause of a given observed discrepancy, then it would be possible to determine precisely whether the present sampling rate is too fast, or whether it is too slow, as explained below.

As discussed previously, the XSUM and XSUM values computed by a Discrete Fourier Transform may be divided by N/2 (in the present case, N=4) in order to compute the X and Y coordinates of a point on the circumference of a circle. That circle may be regarded as a "sine wave generator." The point (X,Y) represents the instantaneous state of that sine wave generator at the moment in time corresponding to when the very first sample contributing to the current XSUM and YSUM values were collected.

With reference to FIG. 8a, with the passing of each quarter cycle (i.e., every time XSUM and YSUM are updated for frequency tracking), the position of the point (X,Y) will advance counter-clockwise around the circle by 90 degrees. If there is no A/D "sampling noise," if the signal being monitored is a "pure" sine wave, and if the amplitude of the AC voltage remains constant, then each new X coordinate will equal the negative of the previous Y coordinate, provided that the sampling rate is correct. If the sampling rate is too fast, then the new (X,Y) point will have advanced beyond the previous (X,Y) point by less than 90 degrees. If the sampling rate is too slow, then the new (X,Y) point will have advanced beyond the previous (X,Y) point by more than 90 degrees. It can be determined which case has occurred by observing only the values of the new YSUM, the new XSUM and the previous YSUM. The signs and ratios of these values are identical to the values of the new Y coordinate, the new X coordinate and the previous Y coordinate, respectively.

In the case where the new (X,Y) point falls either in quadrant I or in quadrant II of the circle depicted in FIG. 8a, then the new YSUM will be a positive number, and control will pass from the decision block 435 to the decision block 440.

At this point, if the sampling rate is too fast and the new (X,Y) point falls in quadrant I, then the new X will be a positive number which is a little bit larger than the negative of the previous Y, so the sum of the new X and the old Y will be a positive number, and likewise the sum of the new XSUM and the old YSUM will be a positive number. Control therefore passes from the decision block 440 to an action block 450. On the other hand, if the sampling rate is too slow and the new (X,Y) point falls in quadrant I, then the new X will be a positive number which is a little bit smaller than the negative of the previous Y, so the sum of the new X and the old Y will be a negative number, and likewise the sum of the new XSUM and the old YSUM will be a negative number. Control therefore passes from the decision block 440 to the action block 455.

By similar reasoning, if the new (X,Y) point falls in quadrant II, then control will again pass from the decision block 440 to the action block 450 whenever the sampling rate is too fast, and from the decision block 440 to the action block 455 whenever the sampling rate is too slow.

In the case that the new (X,Y) point falls in either quadrant III or quadrant IV of the circle, then the new YSUM will be a negative number, and control will pass from the decision block 435 to the decision block 445.

Once again, by a line of reasoning similar to that presented above, control will pass from the decision block 445 to the action block 450 whenever the sampling rate is too fast, and from the decision block 445 to the action block 455 whenever the sampling rate is too slow.

In the chance event that the samples submitted to the frequency tracking computations happen to be collected at very close to the 0, 90,180 or 270 degree points, then it is possible that two successive (X,Y) points would fall within the same quadrant of the circle if the sampling rate were too fast, or that they would skip over a quadrant (e.g., progressing from quadrant IV to quadrant II) if the sampling rate were too slow. However, the operations represented in the decision blocks 435, 440 and 445 produce the correct result as long as the actual sampling rate is at least half of the correct sampling rate.

In the action block 450, a variable called DRIFT COUNT (initially 0) is incremented whenever the CPU 200 determines that the sampling rate may be too fast (at the decision blocks 440 and 445). In the action block 455 the same DRIFT COUNT variable is decremented whenever the CPU 200 determines (at decision blocks 440 and 445) that the sampling rate may be too slow. This same DRIFT COUNT variable is used when the voltage signal samples are processed for all three power line phases. It is also maintained across the evaluation of multiple frequency-tracking sample sets (in the present implementation, two).

Factors other than an incorrect sampling rate (e.g., A/D sampling noise) which may cause the DRIFT COUNT to be incremented or decremented tend to be random and cancel out with no (or only a small) net change in the value of DRIFT COUNT. However, a sampling rate which is too fast will consistently cause DRIFT COUNT to become larger, while a sampling rate which is too slow will consistently cause DRIFT COUNT to become more negative.

After DRIFT COUNT has been incremented at action block 450 or decremented at action block 455, control passes to a decision block 415 (FIG. 9c). At this point, the CPU 200 determines whether it is time to adjust the sampling rate, if an adjustment is warranted. In the present implementation, the sampling rate is only adjusted, if necessary, after every eighth sample set, which is every other frequency tracking sample or once every half cycle. In an alternative embodiment, a different time period could be used or the decision could be based instead on the magnitude of the DRIFT CRITERION variable, which is incremented in the action block 420 only when it is determined (decision block 405) that a large enough AC voltage signal is present to warrant an attempt to track its frequency.

Whenever the CPU 200 determines (decision block 415) that it is time to adjust the sampling rate (if needed), control passes to a decision block 465. If the absolute value of DRIFT COUNT is greater than ½ of the DRIFT CRITERION, control passes to a decision block 470. Otherwise, the present sampling rate is probably correct, and control passes directly to an action block 466 where the DRIFT CRITERION and DRIFT COUNT variables are reset to zero.

The present embodiment ratio of ½ represented in the decision block 465 was chosen by experimentation which has shown that this ratio usually results in adjusting the sample rate up or down whenever the current sample rate is actually incorrect by a small but significant amount. This ratio also usually results in leaving the sample rate unchanged whenever the present sample rate is correct and a non-zero value of DRIFT COUNT was simply caused by noise. A smaller ratio, e.g., ¼, could be used if the effect of extraneous factors such as sampling noise is known to be very small and tracking the actual frequency more closely is desired. A larger ratio, e.g., ¾ or even 1/1, could be used if the effect of extraneous factors is known to be large, and it is acceptable to track the actual frequency less closely.

Whenever the CPU 200 determines (decision block 465) that the sample rate should be adjusted, control passes to a decision block 470 where the sign of the DRIFT COUNT variable is examined. If DRIFT COUNT is a positive number, this indicates that the present sample rate is probably too fast, and control passes to an action block 475 where the Timer Modulus Register (TMR) is incremented, causing the sampling rate to decrease a small amount. On the other hand, if DRIFT COUNT is a negative number, this indicates that the present sampling rate is probably too slow, and control passes to an action block 480 where the TMR is decremented, causing the sample rate to increase a small amount. After the sampling rate has been adjusted in either action block 475 or action block 480, control passes to the action block 466 where the DRIFT COUNT and DRIFT CRITERION variables are reset to zero. Control then returns to the main process (FIG. 5a) via the return block 458.

Advantageously, the amount of change in the actual sampling rate caused by incrementing or decrementing the TMR by a single count is quite small. In the present embodiment, a change from 960 to 958.8 samples per second results when the value stored in the TMR is incremented from 799 to 800. (A rate of 960 samples per second is correct for sampling from a 60 Hz sine wave, and 958.8 samples per second is correct for sampling from a 59.93 Hz sine wave.)

Also advantageously, the frequency with which decisions are made whether to adjust the sampling rate is quite high (Approximately 120 times per second in the present implementation, which is equivalent to 12 times during the course of accumulating the 96 sample sets that contribute to each recalculation of Amps, Volts and Phase Angle). In any implementation, the overall performance of the frequency tracking procedure depends on striking an effective balance among these various parameters. Experimentation is a good guide in determining the optimal values for the application.

The above-described method is performed sequentially for each of the three phases of the voltage signal, and is activated on the occurrence of a sample at every quarter cycle of the component sine wave of interest (so that four samples for each phase are analyzed each 60 Hz cycle). In this manner, the frequency of the component sine wave of interest is effectively tracked, and the sampling rate is adjusted accordingly to insure that a whole number of samples are taken for each cycle of the component sine wave of interest.

Computing Unscaled Root Mean Squared Valued

The RDU 100, having read the digitized values of the low-voltage sense signals and the digitized values of signals representing current from the clamp-on CTs 140 from the A/D converter 150, and having determined the relative phase angle between the voltage and current, calculates values corresponding to the RMS voltage and current, the watts (W), the volt-amperes (VA), the volt-amperes-reactive (VAR) and the power factor (PF), as represented action blocks 310 and 312 (FIG. 5a). If an RDU 100 is monitoring a three-phase power equipment line, then it also calculates three-phase power and the neutral current, as represented in action block 316.

The first step in these calculations is to find the root mean square (RMS) values of the voltage and current sine waves, as represented in the action block 310. The computationally efficient method of calculating the RMS values is to sum the square of each sample value and divide by the number of samples, subtract the square of the sample mean, and take the square root as follows:

$$RMS = \sqrt{\frac{\sum_{1}^{n} S^2}{n} - \left[\frac{\sum_{1}^{n} S}{n}\right]^2}$$

Where
S = Sample value
n = number of samples

This provides RMS values for the digitized representations of the sampled sine waves. Since the sum and sum of squares values are constantly maintained, this computation is readily executed.

Scaling of the RMS Values

However, because the voltage sense signals, and the signals from the clamp-on CTs 140 are scaled down substantially from actual line voltages and currents, the raw RMS values do not represent physical engineering units for amperes or volts. Therefore, each RDU 100 utilizes scaling information to scale the voltage and current calculations to represent actual substation power line values.

A respective scaling factor is applied to the voltage and amperes RMS values. This is accomplished through computation of the following equation:

$$\text{full scale engineering units} \times \frac{\text{measured RMS value}}{\text{full scale RMS value}}$$

For instance if the full scale engineering units for current on the power line is 300 Amps, 300 is multiplied by the measured RMS value and the quantity is divided by the maximum RMS value which can be obtained. In the present embodiment, the A/D converter 150 has a range of 0–4095, with 0 representing the maximum negative value of the sampled sine wave and 4095 representing the maximum positive value of the sine wave. The maximum RMS sample value is 2047 divided by $\sqrt{2}$. The value of 2048 being essentially half of 4095. The measured RMS value will be in the range of 0–2047 divided by $\sqrt{2}$.

Computing Watts, Vars and Power Factor

After the sample data is calibrated and scaled, the RDU 100 calculates volt-amps by multiplying the scaled voltage by the scaled current. The watts and vats are computed by multiplying volt amps by the cosine or the sine of the relative phase angle respectively. The power factor is computed as the cosine of the relative phase angle between the current and voltage. Power factor is expressed as an integer value in the range of +/−10000, where 10000 represents 1.0000. These calculations are represented in action block 312.

If the system is monitoring a three-phase equipment line (represented in decision block 314), the three-phase values are also calculated, as represented in action block 316, as follows:

Three phase volts=average of volts for all three phases.

Three-phase amps=sum of amps for the three individual phases

Three-phase volt amps=sum of volt amps for the three individual phases

Three-phase watts=sum of watts for the three individual phases.

Three-phase vars=sum of vars for the three individual phases.

These calculations are well understood in the art.

The RDUs 100 store the data acquired and the calculation results in its RAM 160, as represented in action block 318.

Once the RDUs 100 have stored the data acquired, the RDUs determine whether any control functions are necessary, as represented in decision block 320. A control function would normally be carried out utilizing the digital I/O interface 190 of the RDU 100. In one embodiment, the digital interface 190 has 12 digital inputs and 12 digital outputs. An exemplary use for the digital inputs is to monitor circuit breaker status in the substation. Two digital inputs can be used for each circuit breaker. One digital input to indicate that a selected circuit breaker (not shown) is open and one input to indicate that the selected circuit breaker is closed. The digital outputs of the digital interface 190 can be used to perform other control functions as may be needed throughout the substation. The RTU 104 has similar capabilities.

If a control function is necessary, then the RDU 100 will perform that control function, as represented in action block 322. If no control functions are currently requesting service from the RDU 100, the RDU 100 executes any serial communications commands, as represented in action block 324, if the RTU 104 has requested information from the RDU 100.

Interrupt Driven Tasks

As explained above, the data collection routine of FIG. 9 is an interrupt initiated task. The RDU 100 also accepts additional interrupt-driven tasks which occur asynchronously to the main tasking.

For instance, the CPU clock is configured to interrupt the CPU 200 once every second. The system maintains a 1 second counter which measures the seconds elapsed since Jan. 1, 1970. The serial I/O interface 172 provides another interrupt. Whenever the RDU 100 receives or transmits a character via its serial I/O interface 172, an interrupt is generated. This interrupt causes the next character to be sent or stored in the RAM 160 by the CPU 200. At the end of the transmission or reception of data, the serial interface sets a flag for the CPU 200 indicating that the transmit buffer has been sent or that a receive buffer is available. This serial interface protocol is well understood in the art.

Communications Capability

Advantageously, the RDU 100 communicates with the RTU 104 via a serial communications multidrop interface well understood in the art. Data transfers are carried out using eight-bit protocol as well understood in the art. All RDUs 100 connected to one RTU 104 communicate over this local area network (LAN) where communications are multidropped over the same wire. Thus, the RTU 104 transmits and receives, and all the RDUs 100 transmit and receive over one pair of wires. The resulting system is a peer-to-peer communications structure as well understood in the art. The RDUs 100 collect and analyze large amounts of data as explained above, which they transmit to the RTU 104 upon request.

In the present embodiment, communications between the RDUs 100 and the RTU 104, and between the RTU 104 and the host 110 advantageously adhere to the NetCom protocol proprietary to the Metricom Corporation. However, other protocols well understood in the art for serial communications in a LAN are also appropriate for use with the system and do not detract from the subject matter regarded as invention.

RTU Specific Firmware

Figure 6:
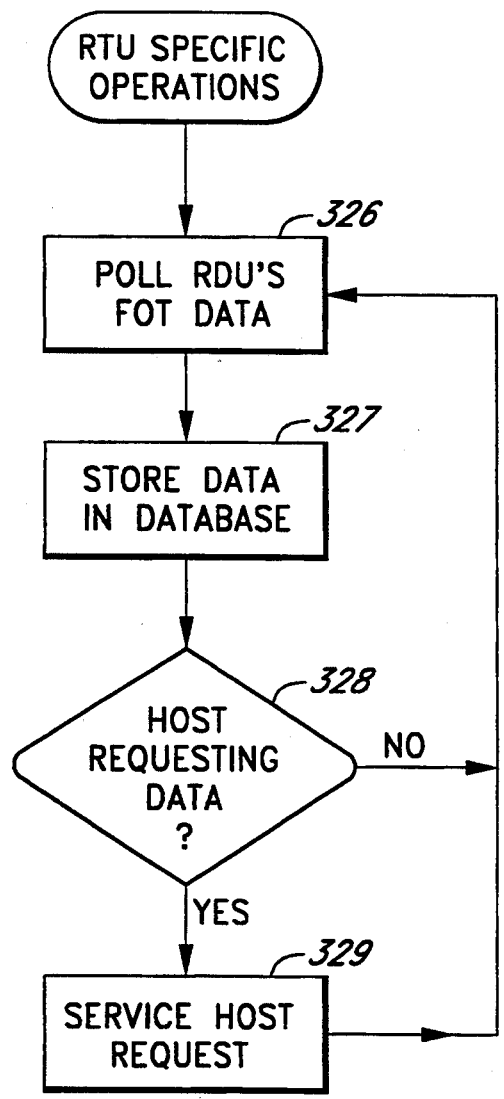
FIG. 6 is an exemplary flow chart for the firmware of the RTU.

As depicted in the flow chart of FIG. 6, the RTU 104 is programmed to perform a number of functions that the RDUs 100 do not generally perform. The RTU 104 polls the RDUs 100, as represented in action block 326, to obtain the data collected and processed by the RDUs 100 as explained above, and stores this data for each RDU 100 in a database, as represented in action block 327. The RTU 104 provides this data to the host 110 upon request via the communications link 106 (FIG. 1), as represented in decision block 328 and action block 329.

Remote RDU Configuration

The present invention can also be implemented without an RTU 104 at each substation location, as illustrated in FIGS. 7 and 7a. The RDUs 100–100B still form a daisy chained network, and a local step-down power converter/supply 350 accepts the sense voltages (e.g., 120 VAC) from the power equipment on lines 272 and converts these to low voltage (e.g., 0–5 volt) AC sense voltages accepted by RDUs 100. The local power supply 350 accepts station power on line 352 and provides the 24-volt DC power for the RDU 100 power supply 130 (FIG. 2). The data collected and calculated by the RDUs 100, 100A and 100B (FIG. 7a) is transmitted to a remote RTU 104 via a radio transmitter 354, or other communications link. The RTU 104 then receives the signals from the remote RDUs 100 via the radio 356. The RTU 104 may also monitor other RDU 100 devices locally, as shown in FIG. 7 as RDU 100C and 100D.

Although the preferred embodiment of the present invention has been described and illustrated above, those skilled in the art will appreciate that various changes and modifications to the present invention do not depart from the spirit of the invention. Accordingly, the scope of the present invention is limited only by the scope of the following appended claims.

What is claimed is:

1. A method of monitoring power distribution equipment carrying voltage and current to distribute electrical power, said monitoring method comprising the steps of:

sampling periodic waveforms representative of said current and said voltage within said power equipment to obtain samples which are substantially equally spaced in time so that said samples have a sample period, said samples having magnitudes and wherein a value derived from said magnitudes of said samples is used as feedback to maintain a sample rate such that a period of the periodic waveforms is substantially an integer multiple of said sample period; and analyzing said sample values by means of a discrete Fourier Transform to obtain a relative phase between the voltage and current waveforms.

2. A method of determining the relative phase between a periodic voltage waveform and a periodic current waveform carried in power equipment, said determining method comprising the steps of:

simultaneously sampling said periodic current waveform and said periodic voltage waveform at a sampling rate to obtain first and second sets of sample values, said first set of sample values comprising a representation of said periodic current waveform with discrete sample values substantially equally spaced in time to define a first sample period, said second set of sample values comprising a representation of said periodic voltage waveform with discrete sample values substantially equally spaced in time to define a second sample period and wherein a feedback value derived from said first and second sets of sample values is used as feedback to automatically adjust said sample rate to insure that a period of said periodic current waveform is substantially an integer multiple of said first sample period and a period of said periodic voltage waveform is substantially an integer multiple of said second sample period;

applying a discrete Fourier Transform to the first and second sets of sample values of said periodic voltage waveform and said periodic current waveform to obtain a phase of said periodic voltage waveform and a phase of said periodic current waveform; and comparing the phase of said periodic voltage waveform and said periodic current waveform to obtain a relative phase between said periodic voltage waveform and said periodic current waveform.

3. The method of claim 2, wherein said step of sampling comprises digitally sampling said periodic current waveform and said periodic voltage waveform through an analog to digital convertor.

4. The method of claim 2, further comprising the steps of:

calculating an RMS voltage from said second set of sample values; and calculating an RMS current from said first set of sample values.

5. The method of claim 4, further comprising the steps of:

multiplying the RMS voltage by the RMS current to obtain a volt-amps value.

6. The method of claim 5, further comprising the steps of:

multiplying said volt-amps value by the cosine of the relative phase to determine the watts.

7. The method of claim 5, further comprising the steps of:

multiplying said volt-amps value by the sine of the relative phase to determine the vars.

8. A method of taking an integer number of sample values per cycle of a periodic voltage or current waveform carried by power equipment, said method comprising the steps of:

sampling said periodic voltage or current waveform at a selected sampling rate corresponding to a first expected frequency to obtain a first set of samples equally spaced in time to define a first sample period and covering substantially a first cycle of said periodic voltage or current waveform;

transforming the samples from said first set of samples by means of a discrete Fourier Transform to obtain a first X transform value and a first Y transform value;

sampling said periodic voltage or current waveform at said selected sampling rate to obtain a second set of samples equally spaced in time to define a second sample period, said second set of samples covering at least a portion of a second cycle of said periodic voltage or current waveform;

transforming at least one of the samples from said second set of samples by means of a discrete Fourier Transform to obtain a second X transform value and a second Y transform value;

comparing said first Y transform value with said second X transform value; and adjusting said selected sampling rate in response to said comparison to insure that a period of said periodic voltage or current waveform is substantially an integer multiple of said first and second sample periods.

9. The method of claim 8, wherein said step of adjusting said selected sampling rate comprises the steps of:

comparing said first Y transform value with said second X transform value, and if said first Y transform value does not equal the negative of said second X transform value, comparing said second Y transform value with zero and summing the second X transform value with said first Y transform value to generate a sum;

if said second Y transform value is less than zero, and the sum of said second X transform value and said first Y transform value is less than zero, decreasing said selected sampling rate;

if said second Y transform value is less than zero, and the sum of said second X transform value and said first Y transform value is greater than zero, increasing said selected sampling rate;

if said second Y transform value is greater than or equal to zero, and the sum of said second X transform and said first Y transform value is less than zero, increasing said selected sampling rate; and if said second Y transform value is greater than or equal to zero, and the sum of said second X transform and said first Y transform value is greater than zero, decreasing said selected sampling rate.

10. The method of claim 8, wherein said step of adjusting said selected sampling rate comprises the steps of:

comparing the second X transform value, the first Y transform value, and the second Y transform to determine if said selected sampling rate is too slow to obtain a predetermined integer number of samples per cycle of said periodic voltage or current waveform; and if said selected sampling rate is too slow, increasing said selected sampling rate of an analog to digital converter which obtains said first set of samples and said second set of samples.

11. The method of claim 8, wherein said step of adjusting said selected sampling rate comprises the steps of:

comparing the second X transform value, the first Y transform value, and the second Y transform to determine if said selected sampling rate is too fast to obtain a predetermined integer number of samples per cycle of said periodic voltage or current waveform; and if said selected sampling rate is too fast, decreasing selected sampling rate of an analog to digital converter which obtains said first set of samples and said second set of samples.

* * * * *